United States Patent
Futatsuyama

(10) Patent No.: US 7,099,193 B2
(45) Date of Patent: Aug. 29, 2006

(54) NONVOLATILE SEMICONDUCTOR MEMORY DEVICE, ELECTRONIC CARD AND ELECTRONIC APPARATUS

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 10/934,626

(22) Filed: Sep. 7, 2004

(65) Prior Publication Data
US 2005/0105334 A1    May 19, 2005

(30) Foreign Application Priority Data
Sep. 8, 2003    (JP) .............................. 2003-315782

(51) Int. Cl.
G11C 16/04    (2006.01)
G11C 16/06    (2006.01)
G11C 5/14    (2006.01)
G11C 8/00    (2006.01)

(52) U.S. Cl. ........................... 365/185.17; 365/185.18; 365/185.2; 365/185.23; 365/185.28; 365/189.09; 365/230.06

(58) Field of Classification Search ........... 365/185.17, 365/185.18, 185.2, 185.23, 185.28, 189.09, 365/230.06
See application file for complete search history.

(56) References Cited

U.S. PATENT DOCUMENTS 5,386,422 A * 1/1995 Endoh et al. .......... 365/185.22
6,064,611 A   5/2000 Tanaka et al.
6,987,694 B1 * 1/2006 Lee ........................ 365/185.17
7,020,026 B1 * 3/2006 Guterman et al. ..... 365/185.28
2002/0126532 A1   9/2002 Matsunaga et al.

FOREIGN PATENT DOCUMENTS

JP    10-283788    10/1998
JP    2002-260390    9/2002

* cited by examiner

Primary Examiner—Amir Zarabian
Assistant Examiner—Ly Duy Pham
(74) Attorney, Agent, or Firm—Oblon, Spivak, McClelland, Maier & Neustadt, P.C.

(57) ABSTRACT

A nonvolatile semiconductor memory device includes a NAND cell with a plurality of electrically data rewritable memory cells being connected in series, word lines connected to control gates of the memory cells, a common source line connectable to one end of the NAND cell, a bit line connectable to a remaining end of the NAND cell, and a word line control circuit. The word line control circuit supplies a word line of a selected memory cell with a write voltage for writing data into this memory cell, supplies a word line of a memory cell located on the common source line side by N (N is an integer greater than or equal to 2) cells from the selected memory cell with a reference voltage for causing this memory cell to cut off, supplies an auxiliary voltage less than the write voltage to respective word lines of N−1 memory cells located between the selected memory cell and the memory cell at the position of the N cells, and supplies to word lines of remaining memory cells an intermediate voltage between the write voltage and the reference voltage.

70 Claims, 29 Drawing Sheets

NONVOLATILE SEMICONDUCTOR MEMORY DEVICE, ELECTRONIC CARD AND ELECTRONIC APPARATUS

CROSS-REFERENCE TO RELATED APPLICATION

This application is based upon and claims the benefit of priority from the prior Japanese Patent Application No. 2003-315782, filed on Sep. 8, 2003, the entire contents of which are incorporated herein by reference.

BACKGROUND OF THE INVENTION

1. Field of the Invention

The present invention relates to electrically data rewritable non-volatile semiconductor memory devices.

2. Description of the Related Art

Conventionally, nonvolatile semiconductor memory devices capable of electrically rewriting data, such as electrically erasable programmable read-only memory (EEPROM), are known as one type of semiconductor memories. Among them, an EEPROM of the NAND type having a NAND cell attracts the attention of technicians as the one that can be highly integrated. The NAND cell is arranged by series connection of a plurality of memory cells, each of which is a unit for storing 1 bit of data. The NAND type EEPROM is adaptable for use as a memory card for storing image data of digital still cameras, by way of example.

Memory cells of a NAND-EEPROM has an FET-MOS structure in which a floating gate (charge accumulation layer) and a control gate are stacked or multilayered above a channel region of a semiconductor substrate, with a dielectric film interposed therebetween. The control gate is connected to a word line. A NAND cell is configured from a plurality of memory cells which are connected in series together in the form that a source/drain is commonly used or "shared" by neighboring ones of the plurality of cells. The source/drain as used herein refers to an impurity-doped region which functions as at least either one of the source and drain of a transistor.

Here, one example of a data write or "programming" scheme in the NAND type chip will be explained in brief.

(1) "0" Write

In a state that the voltage of a channel region is set at 0V, select a word line of a memory cell into which a logic "0" is to be written; then, set the voltage of this word line at 20V for example, and set the word lines other than this word line at 10V for instance. As a potential difference between the selected word line (control gate) and the channel region is significant large, electrons are injected into the floating gate of the above-noted memory cell in the form of a tunnel current. Whereby, the memory cell comes to have its threshold voltage which is set in a positive state ("0"-written state).

(2) "1" Write

After having set the channel region in a floating state with a prespecified voltage higher than or equal to 0V, select the word line of a memory cell into which a logic "1" is to be written and then set the voltage of this word line at 20V in a similar way to the case of "0" write. Set the voltages of those word lines other than this word line at 10V for example. With these voltage settings, the channel region increases in potential due to the presence of a capacitive coupling with respect to the selected word line (control gate); for example, it potentially rises up to approximately 8V. In this case, unlike the case of "0" write, the potential difference between the selected word line (control gate) and the channel stays less so that the floating gate of the "1"-written memory cell hardly experiences any electron injection due to the flow of a tunnel current. Accordingly, the threshold voltage of the above-noted memory cell is kept in a negative state ("1" written state).

In another example of the write scheme of NAND-EEPROM, writing is done while setting at 0V the word lines of memory cells that are respectively located next to the both neighboring memory cells of a selected memory cell, in order to preclude or avoid erroneous writing to a memory cell (for example, see FIG. 10(b) of Published Japanese Patent Application No. 2002-260390).

SUMMARY OF THE INVENTION

It is therefore an object of the present invention to provide a nonvolatile semiconductor memory device capable of avoiding write errors, an electronic card equipped with this memory device, and an electronic apparatus utilizing this electronic card.

In accordance with one form of the nonvolatile semiconductor memory device in accordance with the present invention, the memory device includes a NAND cell with a plurality of electrically data rewritable memory cells which are connected in series, word lines connected to control gates of the memory cells, a common source line connectable to one end of the NAND cell, a bit line connectable to the other end of the NAND cell, and a word line control circuit. The word line control circuit is operable to supply a word line of a selected memory cell with a write voltage for writing data into this memory cell, supply a word line of a memory cell located on the common source line side by N (N is an integer greater than or equal to 2) cells from the selected memory cell with a reference voltage for causing this memory cell to cut off, supply an auxiliary voltage less than the write voltage to respective word lines of N−1 memory cells located between the selected memory cell and the memory cell at the position of the N cells, and supply to word lines of the other memory cells an intermediate voltage between the write voltage and the reference voltage.

In accordance with another form of this invention, a nonvolatile semiconductor memory device includes a NAND cell with a plurality of electrically data rewritable memory cells being connected in series, word lines connected to control gates of the memory cells, a common source line connectable to one end of the NAND cell, a bit line connectable to the other end of the NAND cell, and a word line control circuit, wherein the word line control circuit supplies a word line of a selected memory cell with a write voltage for writing data into this memory cell, supplies word lines of memory cells respectively located on the common source line side and on the bit line side by N (N is an integer greater than or equal to 3) cells from the selected memory cell with a reference voltage for cutting this memory cell off, supplies an auxiliary voltage less than the write voltage to respective word lines of N−1 memory cells located between the selected memory cell and the memory cell at the position of the N cells, and supplies to word lines of the other memory cells an intermediate voltage between the write voltage and the reference voltage.

In accordance with still another form of the invention, a nonvolatile semiconductor memory device includes a NAND cell with a plurality of electrically data rewritable memory cells being connected in series, word lines connected to control gates of the memory cells, a common source line connectable to one end of the NAND cell, a bit line connectable to the other end of the NAND cell, and a word line control circuit, wherein the word line control circuit supplies a word line of a selected memory cell with a write voltage for writing data into this memory cell, supplies at least a word line of a memory cell located on the common source line side between memory cells located on the common source line side and on the bit line side by N (N is an integer greater than or equal to 2) cells from said selected memory cell, with a reference voltage for cutting this memory cell off, supplies an auxiliary voltage less than the write voltage to respective word lines of N-1 memory cells located between the selected memory cell and the memory cell which is at the position of the N cells and which has its word line to which the reference voltage is supplied, supplies to word lines of the other memory cells an intermediate voltage between the write voltage and the reference voltage, and makes a timing for supplying the auxiliary voltage different from that of the intermediate voltage.

In accordance with a further form of the invention, a nonvolatile semiconductor memory device includes a NAND cell with a plurality of electrically data rewritable memory cells being connected in series, word lines connected to control gates of the memory cells, a common source line connectable to one end of the NAND cell, a bit line connectable to the other end of the NAND cell, and a word line control circuit, wherein the word line control circuit supplies a word line of a selected memory cell with a write voltage for writing data into this memory cell, supplies a word line of a memory cell located on the common source line side by N (N is an integer greater than or equal to 2) cells from the selected memory cell with a reference voltage for cutting this memory cell off, supplies an auxiliary voltage less than the write voltage to respective word lines of N-1 memory cells located between the selected memory cell and the memory cell at the position of the N cells, supplies an intermediate voltage between the write voltage and the reference voltage to one of word lines located next to the word line of the selected memory cell which is a bit-line side neighboring word line that is a word line on the bit line side, supplies the intermediate voltage to word lines of the other word lines, and makes a timing for supplying the auxiliary voltage and a timing for supplying the intermediate voltage to the bit-line side neighboring word line different from a timing for supplying the intermediate voltage to the word lines of the other memory cells.

In accordance with another further form of the invention, a nonvolatile semiconductor memory device includes a NAND cell with a plurality of electrically data rewritable memory cells being connected in series, word lines connected to control gates of the memory cells, a common source line connectable to one end of the NAND cell, a bit line connectable to a remaining end of the NAND cell, and a word line control circuit. The word line control circuit supplies a word line of a selected memory cell with a write voltage for writing data into this memory cell, supplies a word line of at least a memory cell located on the common source side of memory cells which are placed on the common source line side and on the bit line side by a degree corresponding to N cells (N is an integer greater than or equal to 2) from the selected memory cell with a reference voltage for causing this memory cell to cut off, supplies a first auxiliary voltage less than the write voltage to a word line of one of memory cells located on both neighboring sides of the selected memory cell, which one is on the side with a word line to which the reference voltage is supplied, respectively supplies second and third auxiliary voltages less than the write voltage to word lines of memory cells placed on both neighboring sides of the memory cell with the reference voltage being supplied to its word line, supplies an intermediate voltage between the write voltage and the reference voltage to a word line of at least one memory cell of the remaining memory cells except those memory cells located between the memory cell having Its word line to which the first auxiliary voltage is supplied and the memory cell having its word line to which the second auxiliary voltage is supplied, and makes the second and third auxiliary voltages different in supply timing from each other.

In accordance with a further form of the invention, a nonvolatile semiconductor memory device includes a NAND cell with a plurality of electrically data rewritable memory cells being connected in series, word lines connected to control gates of the memory cells, a common source line connectable to one end of the NAND cell, a bit line connectable to a remaining end of the NAND cell, and a word line control circuit. The word line control circuit supplies a word line of a selected memory cell with a write voltage for writing data into this memory cell, supplies a word line of a memory cell located on the common source side by a degree corresponding to N cells (N is an integer greater than or equal to 2) from the selected memory cell with a reference voltage for causing this memory cell to cut off, supplies a first auxiliary voltage less than the write voltage to a word line of one of memory cells located on both neighboring sides of the selected memory cell, which one is on the common source side, respectively supplies second and third auxiliary voltages less than the write voltage to word lines of memory cells located on both neighboring sides of a memory cell with its word line to which the reference voltage is supplied, supplies a fourth auxiliary voltage less than the write voltage to a word line of one of the memory cells located on both neighboring sides of the selected memory cell, which one is on the bit line side, supplies an intermediate voltage between the write voltage and the reference voltage to a word line of at least one memory cell of the remaining memory cells except those memory cells located between the memory cell having its word line to which the first auxiliary voltage is supplied and the memory cell having its word line to which the second auxiliary voltage is supplied, and makes the second and third auxiliary voltages different in supply timing from each other.

DETAILED DESCRIPTION OF THE EMBODIMENTS

Figure 1:
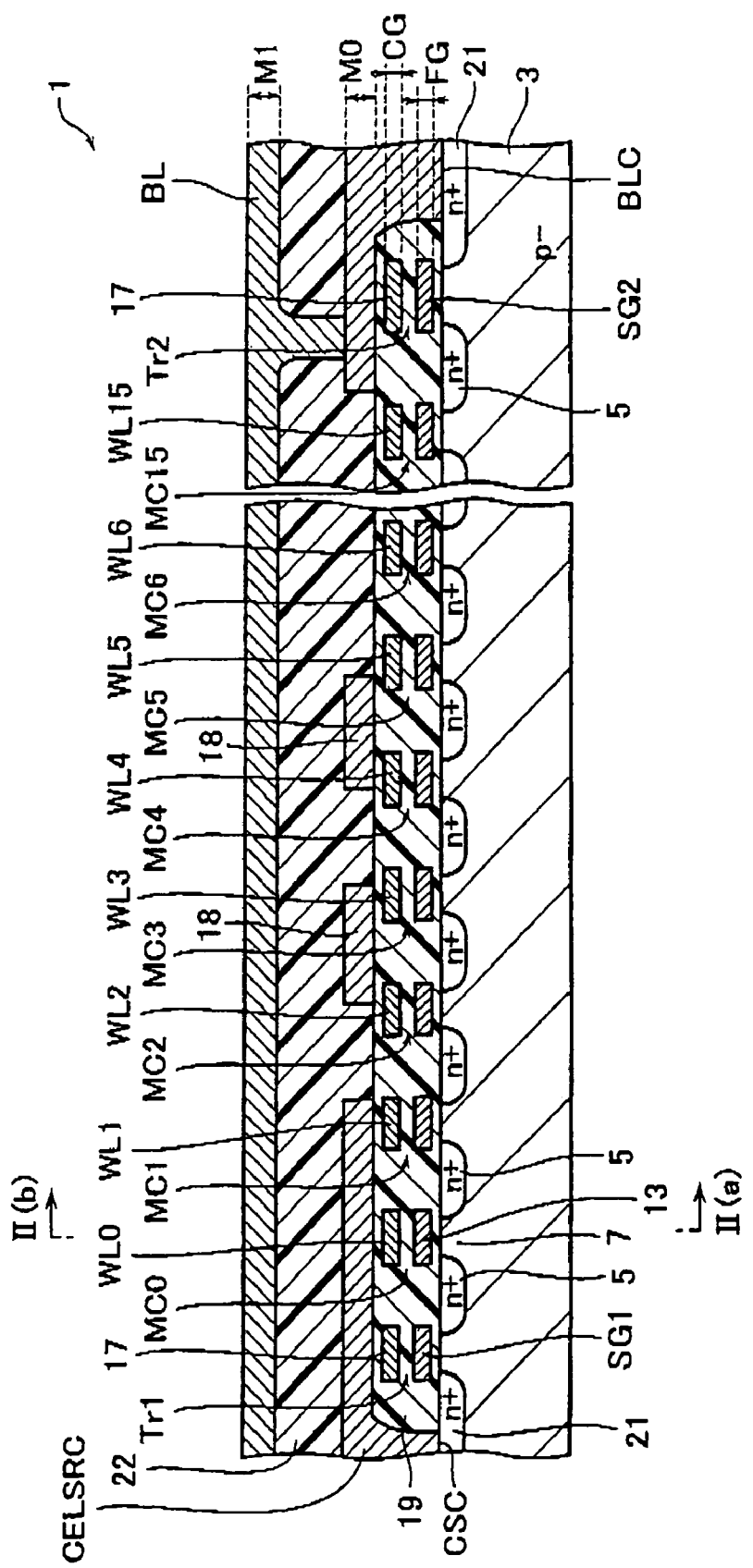
FIG. 1 is a diagram schematically showing, in cross-section, a NAND cell equipped in a NAND type EEPROM in accordance with a first embodiment.

Embodiments of the present invention will be explained while dividing the description into items which follows.
[First Embodiment]
1. NAND Cell Structure
2. NAND Cell Operation
   (1) General Operation Example of NAND Cell
   (2) Improved Example 1
   (3) Improved Example 2
   (4) NAND Cell Operation Example of First Embodiment
[Second Embodiment]
[Third Embodiment]
[Fourth Embodiment]
[Fifth Embodiment]
[Sixth Embodiment]
[Seventh Embodiment]
[Eighth Embodiment]
[Ninth Embodiment]
[Combination of Respective Embodiments]
[Circuit Blocks of Embodiment of the Invention]
[Application to Electronic Card and Electronic Apparatus]

It should be noted that in the drawings for explanation of respective embodiments, the same reference characters are used to denote parts or components which are the same as those indicated by reference characters in the drawings as has already been explained, with explanations thereof eliminated.

First Embodiment

Figure 2:
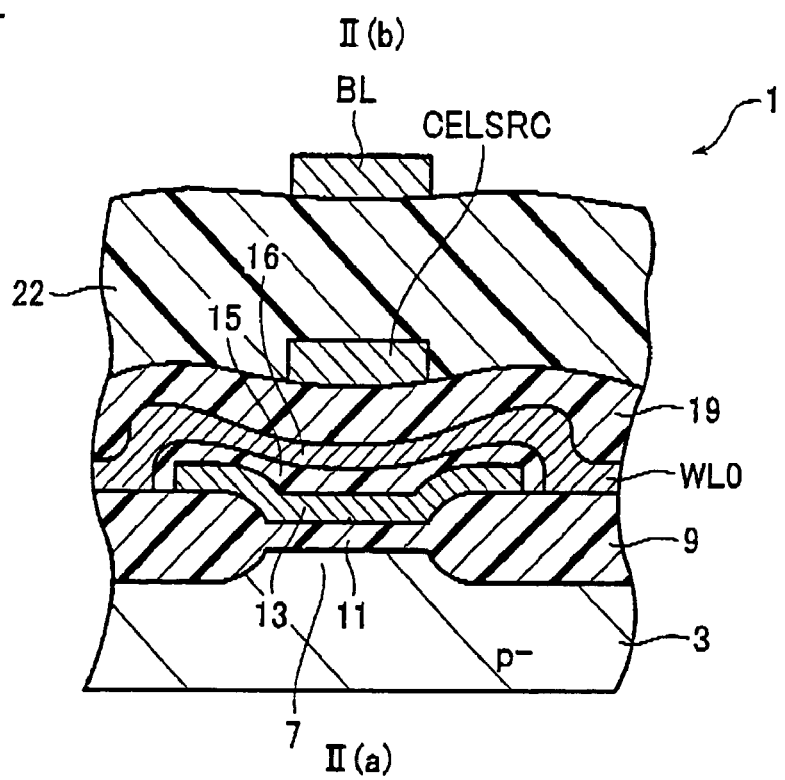
FIG. 2 is a diagram pictorially representing a cross-sectional view of the structure of FIG. 1 as taken along line II(a)–II(b).
Figure 3:
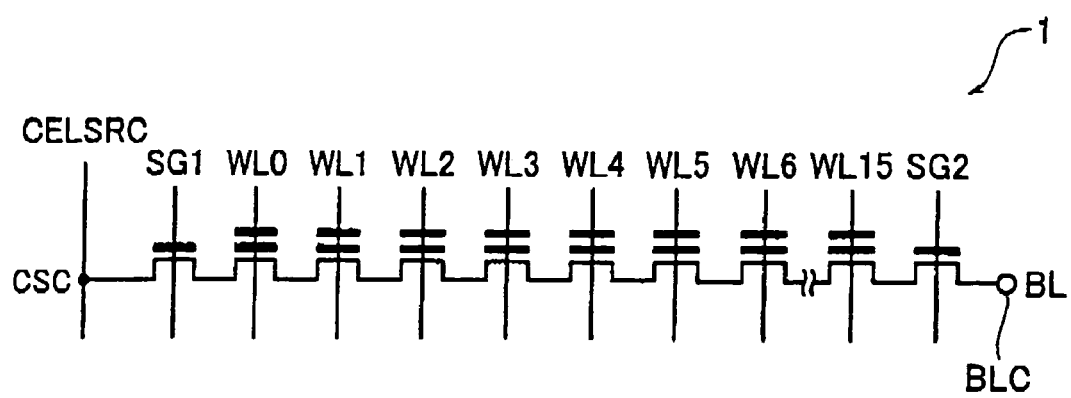
FIG. 3 shows an equivalent circuit of the NAND cell of FIG. 1.

1. NAND Cell Structure
FIG. 1 is a pictorial representation of a cross-section of a NAND cell which is equipped in a NAND type EEPROM in accordance with a first embodiment. FIG. 2 depicts a cross-sectional view of the NAND cell as taken along line II(a)–II(b) of FIG. 1. FIG. 3 is an equivalent circuit diagram of the NAND cell of FIG. 1.

As shown in FIGS. 1–3, the NAND cell 1 is structured so that sixteen (16) memory cells MC0 to MC15 are formed in a semiconductor substrate 3 of the lightly-doped p (p⁻) conductivity type. These memory cells may also be referred to as memory transistors and are nonvolatile cells capable of electrically rewriting data. Each memory cell is the same in structure as the others. Taking the memory cell MC0 as an example, this cell has impurity regions 5 (source/drain) of heavily-doped n (n⁺) type which are formed in a surface of the substrate 3 with a predetermined distance or interval provided, a channel region 7 which is located between adjacent ones of the impurity regions 5 in the substrate 3, an element isolating dielectric film 9 which is formed around the regions 5 and 7, a floating gate 13 that is formed above the channel region 7 with a gate insulation film 11 interposed therebetween and a word line WL0 as formed above the floating gate 13 with a dielectric film 15 sandwiched therebetween in such a way as to extend in a specified direction. A portion of the word line WL0 which is positioned above floating gate 13 functions as a control gate 16 (FIG. 2). Hence, the word line is to be connected to the control gate. Additionally, a floating gate layer FG indicates an electrically conductive layer in which the floating gate 13 is formed, whereas a control gate CG indicates a conductive layer with formation of the control gate 16 therein.

The NAND cell 1 is arranged so that sixteen memory cells are connected in series together while letting a source/drain be shared by neighboring one of these cells. Although the explanation here assumes that the number of the memory cells making up the NAND cell 1 is sixteen (16), the number of memory cells may alternatively be eight (8), thirty two (32), sixty four (64), or else.

On the side of the memory cell MC0, a select transistor Tr1 having a select gate line SG1 is formed. One end of a current flow path of this transistor Tr1 is connected through the impurity region 5 to one end of a current flow path of the memory cell MC0. The select transistor Tr1 is for control of electrical connection and disconnection between the NAND cell 1 and a common source line CELSRC associated therewith. In this way, the common source line CELSRC is designed so that this line is connectable to the one end of NAND cell 1 via the select transistor Tr1.

On the other hand, on the side of the memory cell MC15, a select transistor Tr2 having a select gate line SG2 is formed. The select transistor Tr2 is such that one end of a current flow path is connected through an impurity region 5 to one end of a current flow path of memory cell MC15. Transistor Tr2 controls connection and disconnection between the NAND cell 1 and its associative bit line BL. In brief, the bit line BL is made connectable to the other end of NAND cell 1. As has been stated above, the select transistor Tr1, memory cells MC0–15 and select transistor Tr2 are connected in series, wherein the bit line BL is connected to one end of a current flow path of this series-connection, while the common source line CELSRC is coupled to the other end thereof. Note that a conductive film 17 is present above the select gate line SG1, SG2. The conductive film 17 may be designed so that it is connected to select gate line SG1, 2 or alternatively is set in a floating state.

A first interlayer dielectric film 19 is formed to cover or coat the memory cells MC0–15 and select transistors Tr1–2. A first conductive layer M0 is formed on the first interlayer dielectric film 19. The conductive layer M0 includes the common source line CELSRC and shunt wiring lines 18 of select gates SG1–SG2 and others. The common source line CELSRC is connected to one end of the current flow path of select transistor Tr1, that is, an n⁺-type impurity region 21 that is formed in the semiconductor substrate 3. This connection portion is called a cell-source contact CSC.

A second interlayer dielectric film 22 is formed to cover the first conductive film M0. A second conductive layer M1 is formed on or above the second interlayer dielectric film 22. The layer M1 includes the bit line BL that extends in a direction crossing the word lines WL0–15. The bit line BL is connected to one end of the current flow path of select transistor Tr2, i.e., coupled to an n⁺-type impurity region 21 formed in the semiconductor substrate 3. This connection part is called a bitline contact BLC. Optionally, the NAND cell 1 may be formed in a p-type well region as formed in the semiconductor substrate 3.

Figure 4:
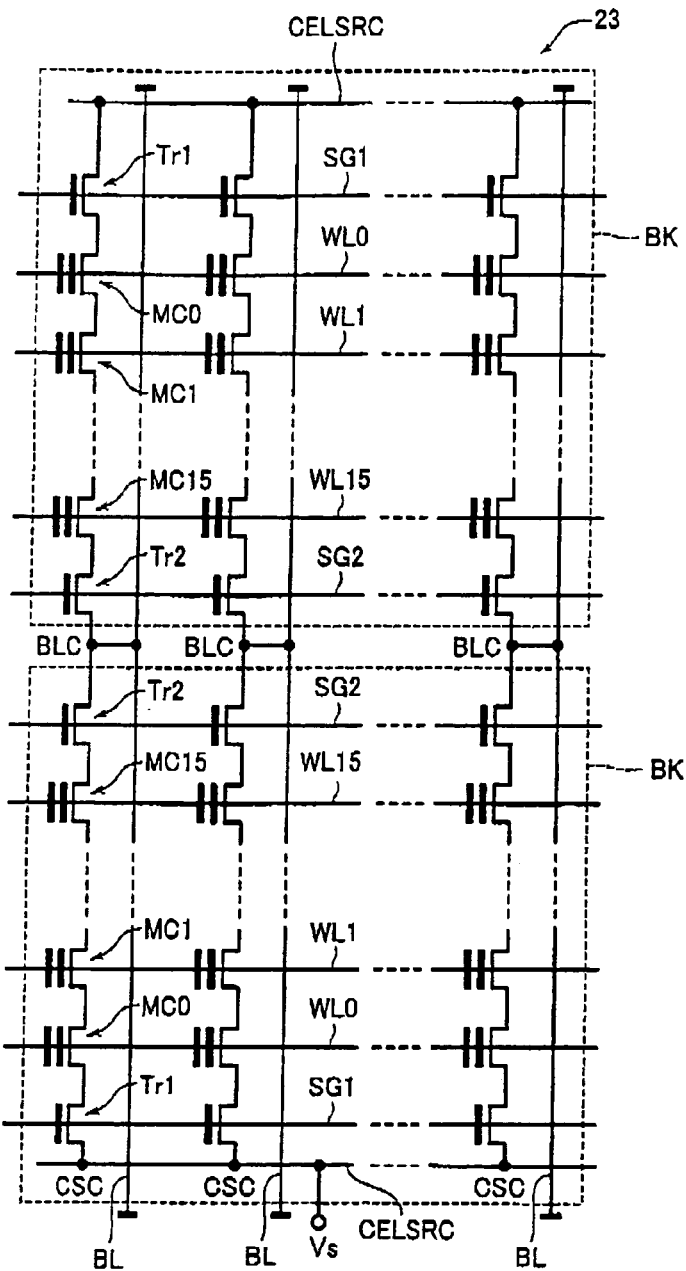
FIG. 4 is an equivalent circuit diagram of part of a memory cell array in accordance with the first embodiment.

NAND cells 1 are laid out and organized into a matrix form (one example of array form) to thereby arrange a memory cell array 23. FIG. 4 is an equivalent circuit diagram of part of the memory cell array 23. The memory cell array 23 is subdivided into a plurality of blocks BK. An area that is surrounded by broken lines in FIG. 4 becomes a single block BK. Operations such as reading and writing are usually executed while selecting one from among the multiple blocks BL.

Word lines WL0–15 are disposed in each block BK so that a respective one is connected in common to those memory cells in the same row of each block BK. The select gate line SG1, 2 also is commonly connected to the same row of select transistors of block BK respectively. A plurality of bit lines BL are made connectable to the same column of NAND cells of the memory cell array 23 respectively.

2. NAND Cell Operation

Prior to explaining about an operation of the NAND cell in accordance with the first embodiment, in order to facilitate the understanding of this operation, an explanation will first be given of (1) a general operation example of the NAND cell, (2) an improved example 1, and (3) an improved example 2. Thereafter, (4) an operation example of the NAND cell in accordance with the first embodiment will be set forth in the description.

(1) GENERAL OPERATION EXAMPLE OF NAND CELL

Figure 5:
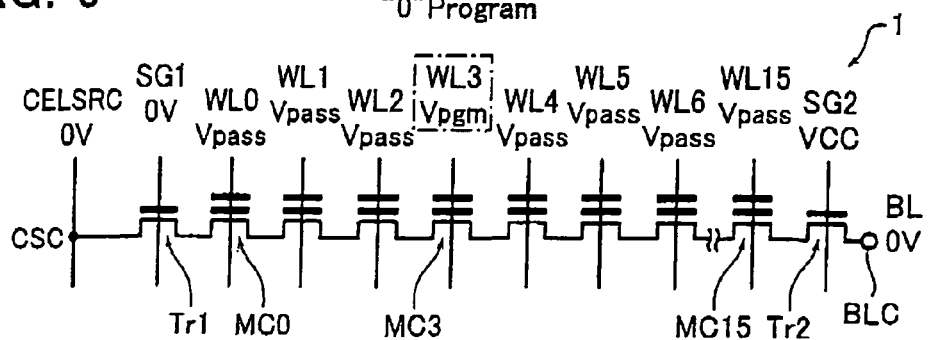
FIG. 5 is an equivalent circuit diagram of a NAND cell including a "0" written memory cell in an ordinary example of a write operation of the NAND cell.
Figure 6:
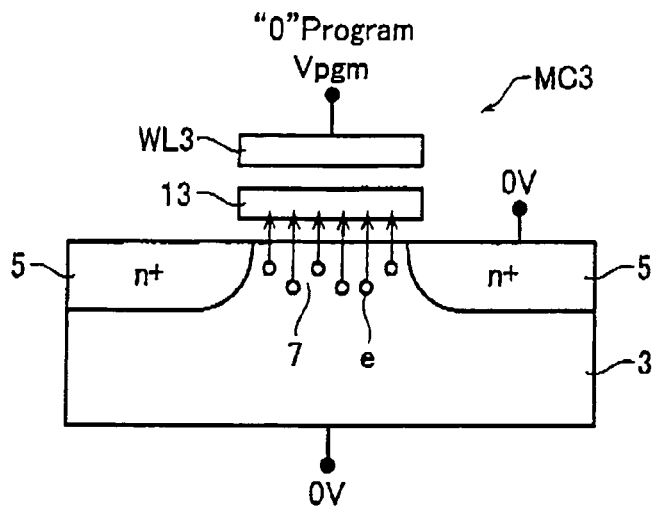
FIG. 6 is a diagram showing a pictorial representation of the "0" written memory cell of FIG. 5.
Figure 7:
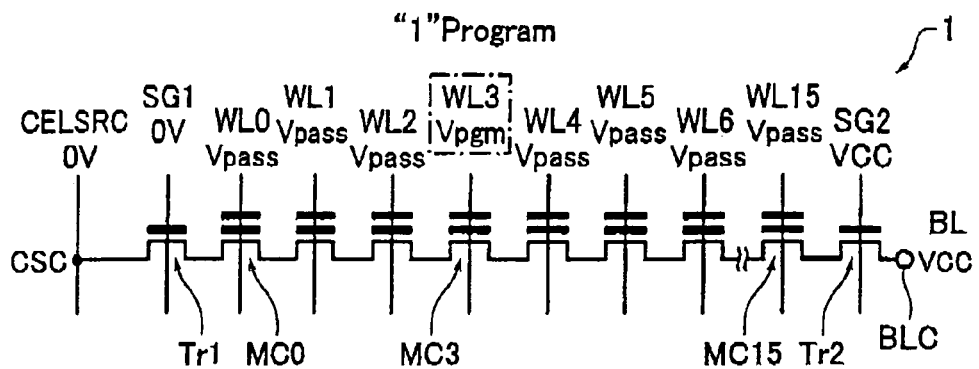
FIG. 7 is an equivalent circuit diagram of a NAND cell including a "1" written memory cell in a general example of the write operation of the NAND cell.
Figure 8:
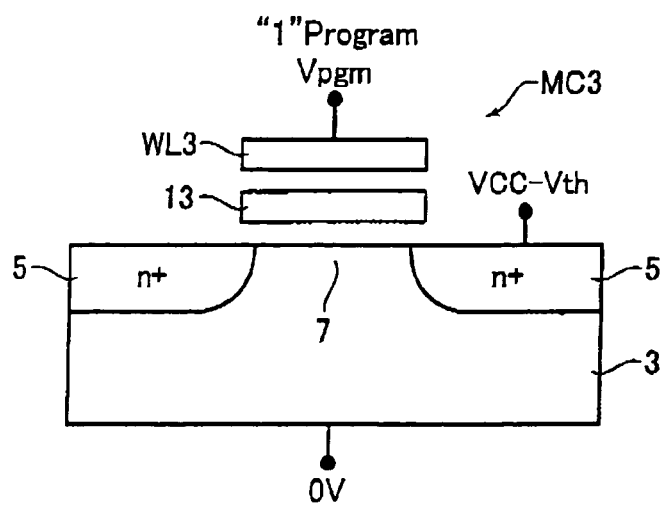
FIG. 8 is a pictorial representation of the "1" written memory cell of FIG. 7.

A write or "programming" operation will be explained with reference to FIGS. 5 to 8. FIG. 5 is an equivalent circuit diagram of a NAND cell including a memory cell which is subjected to "0" programming. FIG. 7 is that in the case of "1" program. The NAND cell 1 of FIG. 5, 7 is the same as the NAND cell 1 of FIG. 3. FIG. 6 is a pictorial representation of the memory cell to which "0" program is performed; FIG. 8 is that in the case of "1" program.

Programming is executed after having set the NAND cell 1 in an erase state—that is, after the threshold voltage of each memory cell of NAND cell 1 is set in a negative voltage state. A program operation is started at a memory cell MC0 which is at a position furthest from the bitline contact BLC, i.e. the memory cell on the source line CELSRC side, and then sequentially performed relative to its following ones. An explanation will be given under an assumption that program is done to a memory cell MC3.

Firstly, in the case of performing "0" programming, as shown in FIGS. 5 and 6, apply VCC (power supply voltage) for example to the select gate line SG2 to thereby cause select transistor Tr2 to turn on, while at the same time setting bit line BL at 0V (ground voltage). Note that select gate line SG1 is at 0V so that select transistor Tr1 maintains its turn-off state.

Next, supply a write or "program" voltage Vpgm (about 20V) to a word line WL3 of memory cell MC3 while supplying an intermediate or "mid-level" voltage Vpass (about 10V) to the other word lines. As the voltage of bit line BL is 0V, its voltage is transferred up to the channel region 7 of the selected memory cell MC3. In short, the potential of channel region 7 is kept at 0V.

Since a potential difference between the word line WL3 (control gate) and the channel region 7 is significant, electrons eare injected into the floating gate 13 of memory cell MC3 due to the flow of a tunnel current. Whereby, the threshold voltage of memory cell MC3 becomes in a positive state ("0"-written state).

On the other hand, the case of performing a "1" program operation will be explained with reference to FIGS. 7 and 8, while focusing on different points from the above-stated "0" program. First, set the bit line BL at VCC (supply voltage), for example. As the voltage of select gate line SG2 is VCC, the select transistor Tr2 is driven to cut off when the voltage of channel region 7 becomes at VCC minus Vth (VCC−Vth, where Vth is the threshold voltage of select transistor Tr2). Thus, the channel region 7 becomes in the floating state with its voltage equal to VCC−Vth.

Next, when supplying the program voltage Vpgm (about 20V) to the word line WL3 while supplying the mid-level voltage Vpass (about 10V) to the other word lines, the voltage of channel region 7 potentially rises up from VCC−Vth to about 8V, for example, due to the presence of capacitive coupling between each word line (control gate) and the channel region 7.

As the voltage of the channel region 7 is potentially raised or "boosted" to a high voltage, unlike the case of the "0" program, the potential difference between word line WL3 (control gate) and channel region 7 is less. Therefore, the floating gate 13 of memory cell MC3 experiences no electron injection due to a tunnel current. Hence, the threshold voltage of memory cell MC3 is kept in a negative state ("1"-written state).

It should be noted that the program operation is accelleratable by performing programming of those memory cells that are common-coupled to a single word line at a time in the so-called "all-at-once" write fashion (for example, simultaneous writing of 2 kilobytes or 512 bytes of data).

An explanation will next be given of an erase operation of general operation examples of the NAND cell. Erasing is simultaneously performed with respect to all the memory cells within a block BK (FIG. 4) of a selected NAND cell. More specifically, set every word line within the selected block BK at 0V, and apply a high voltage (e.g. about 22V) to the semiconductor substrate 3 (see FIG. 1; optionally, a p-type well in case the NAND cell is formed in the p-well). Regarding the bit line, source line, word lines within non-selected blocks and all the select gate lines, set these lines in the floating state. Whereby, in all the memory cells within the selected block BK, electrons on their floating gates are released and drawn out to the semiconductor substrate due to tunnel currents. As a result of this, the threshold voltages of these memory cells shift in the negative direction.

A read operation is as follows. Let the word line of a memory cell of a block which is selected for read be set at 0V for example, and set the word lines of those memory cells that are not selected for read and the select gate lines at either VCC (power supply voltage) or a read-use voltage which is a little higher in potential than the supply voltage. Whereby, detect whether a current flows in the read-selected memory cell.

(2) IMPROVED EXAMPLE 1

An improved example 1 is of the so-called "local self-boost (LSB)" scheme. At the time of "1" programming, if a voltage rise-up of channel region is less, then electrons are injected into a floating gate due to a tunnel current; thus, the resulting operation becomes "0" program. In order to prevent failure of this program operation, the improved example 1 is arranged to set at 0V the word lines of neighboring memory cells on the both sides of a memory cell that is selected for write, thereby to program data therein in a state that the both neighboring or "next-door" memory cells are forced to cut off. Whereby, in the case of "1" program, it is possible to potentially raise or boost the channel of such selected memory cell while letting this channel be set in the floating state in which it is electrically separated or isolated from the channels of the remaining memory cells. This makes it possible to enlarge the potential increase of the channel region. Below is an explanation of an operation of the improved example 1 with reference to drawings.

Figure 9:
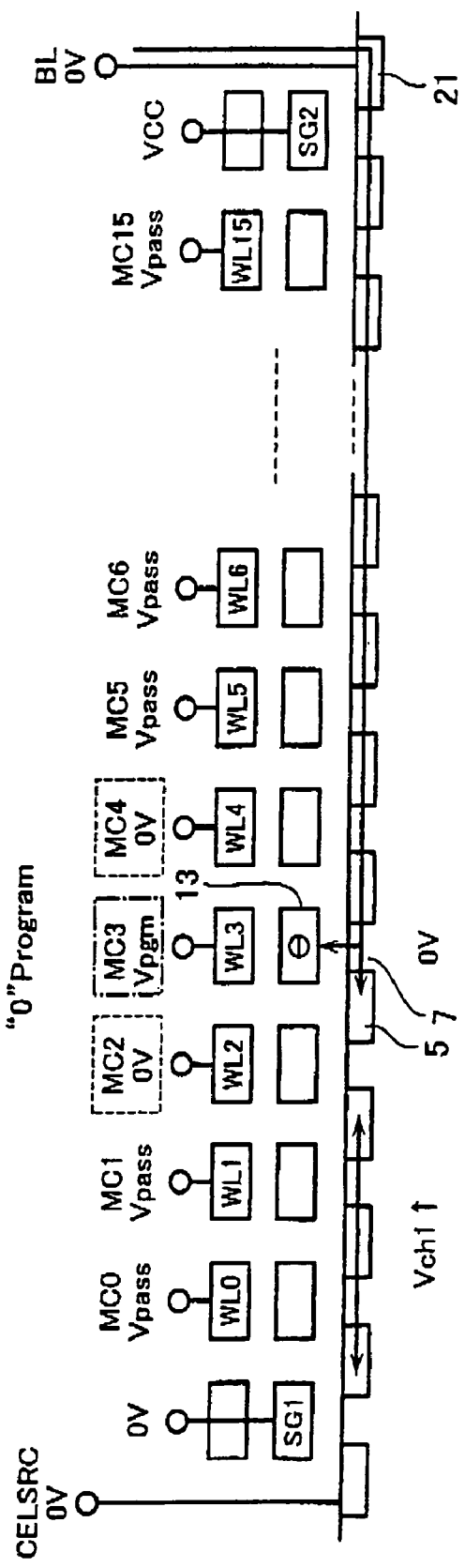
FIG. 9 is a diagram pictorially showing a NAND cell including a "0" written memory cell in an improved example 1.
Figure 10:
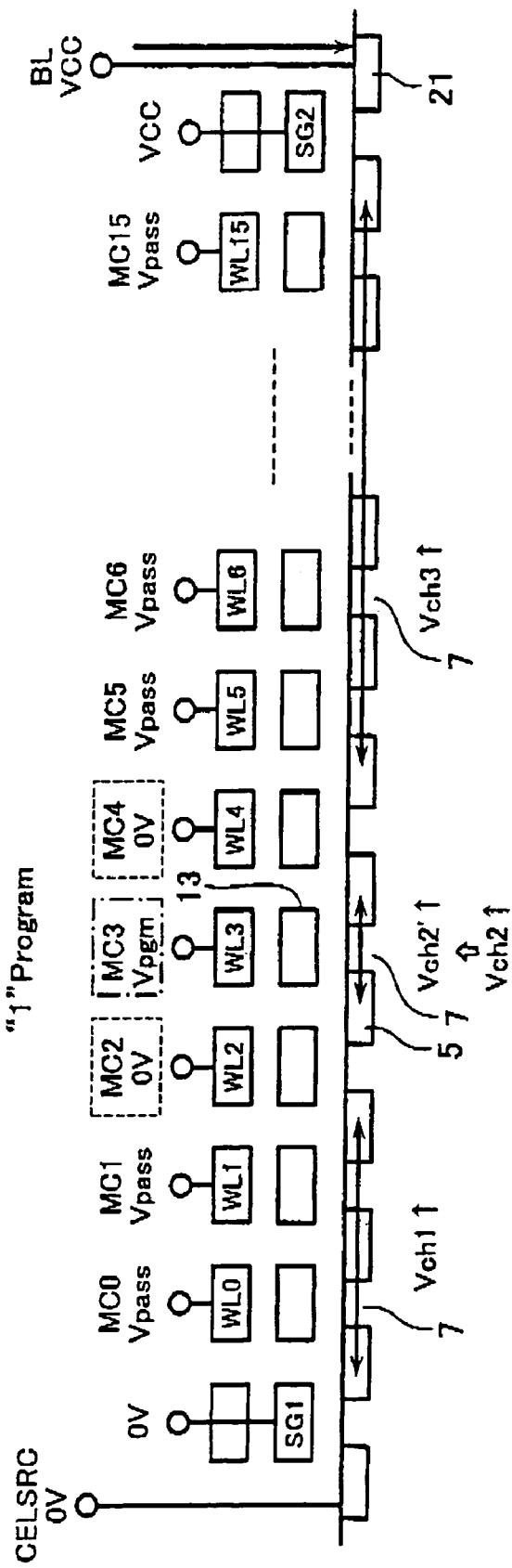
FIG. 10 is a pictorial diagram of a NAND cell including a "1" written memory cell in the improved example 1.
Figure 11:
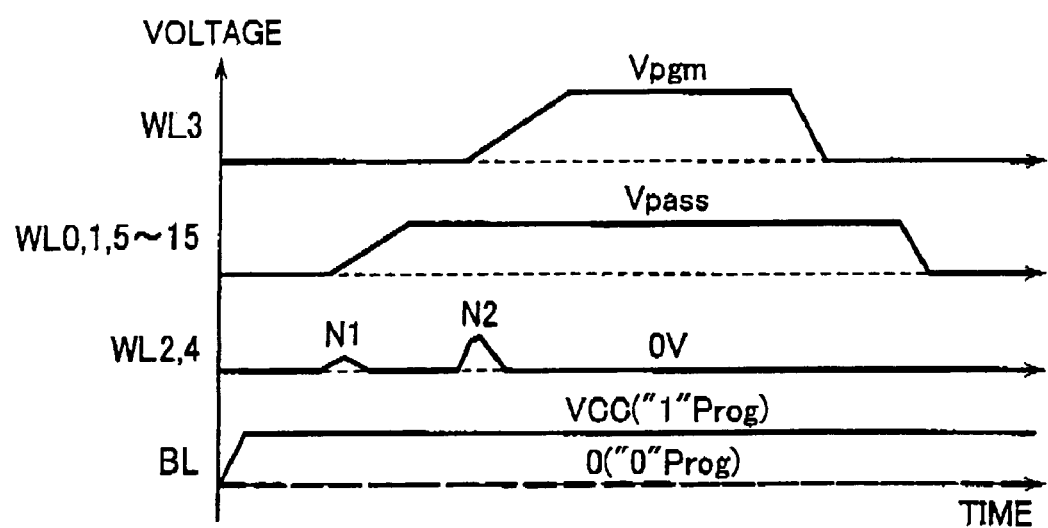
FIG. 11 is a timing chart for explanation of a write operation of the improved example 1.

FIG. 9 is a pictorial representation of a NAND cell including a memory cell into which a logic "0" is written or programmed in the improved example 1. FIG. 10 shows a case where "1" write is done. FIG. 11 is a timing diagram for explanation of program operations in these cases. As for a comparative example, an explanation will be given while focusing on different points from general operation examples of the NAND cell.

("0" Write)

(a) As shown in FIGS. 9 and 11, set a bit line BL at 0V. Memory cells MC3–MC15 are electrically conducted with the bit line BL, since their threshold levels are negative voltages. Hence, the channel regions 7 of these memory cells MC3–15 are potentially set at 0V.

(b) While maintaining at 0V the voltages of word lines WL2 and WL4 of memory cells MC2 and MC4 that are located next to the selected memory cell MC3 the both sides thereof, first set the voltages of word lines WL0–WL1 and WL5–15 at Vpass (10V), and then set the word line WL3 at Vpgm 20V). Whereby, electrons e are injected to the floating gate 13 of memory cell MC3 due to the flow of a tunnel current in a similar way to the case of the general operation example shown in FIG. 6. Thus, the threshold voltage of memory cell MC3 becomes in the positive state ("0"-written state).

("1" Write)

(a) As shown in FIGS. 10 and 11, potentially raise the voltage of a bit line at VCC, resulting in the channel region 7 becoming in the floating state with its potential of VCC−Vth, as has been explained in the general operation example. The voltages of word lines WL2 and WL4 are held at 0V so that memory cells MC2 and MC4 are driven to cut off.

(b) In this state, set the voltages of word lines WL0–WL1 and WL5–15 at Vpass (10V). With this voltage rise-up, the channel regions 7 of memory cells MC0–15 potentially Increase due to the capacitive coupling. More precisely, the potentials of the channel regions 7 of memory cells MC0–1 rise up to Vch1, and the channel regions 7 of memory cells MC5–15 potentially rise up to Vch3, respectively. As the word lines WL2 and WL4 are held at 0V and simultaneously the word line WL3 also is 0V at this time point, the channel region 7 of memory cell MC3 does not experience any potential rise-up due to word lines WL2–4. However, the channel region 7 of memory cell MC3 potentially rises up to Vch2 with an increase in potentials of its both-side channel regions to Vch1 and Vch3 respectively. Vch2 is almost equal to |Vth|, a magnitude with a voltage drop of the lager threshold voltage of the memory cell MC2, 4.

(c) And, as a result of setting the voltage of word line WL3 at Vpgm (20V), the potential Vch2 of the channel region 7 of memory cell MC3 further increases up to a potential Vch2' (around 8V for example). Whereby, the potential difference between the word line WL3 and the channel region 7 of memory cell MC3 becomes smaller. Thus, any electron injection due to a tunnel current no longer occurs at the floating gate 13 of memory cell MC3. Hence, the threshold voltage of memory cell MC3 is held in the negative state ("1"-written state).

(3) IMPROVED EXAMPLE 2

An improved example 2 is of the "erase area self-boost (EASB)" scheme. In this scheme, set at 0V the word line of certain one of the both-side neighboring memory cells of a memory cell being selected for data write which is located on the common source line side, thereby performing data programming while in the state that this memory cell is caused to cut off. Whereby, in the case of "1" program, it is possible to potentially boost the channel of such selected memory cell while at the same time letting this channel be in the floating state in which it is disconnected and isolated from the channel of the memory cell that is positioned on the common source line side. As a result, it is possible to enlarge the voltage rise-up of the channel region.

Figure 12:
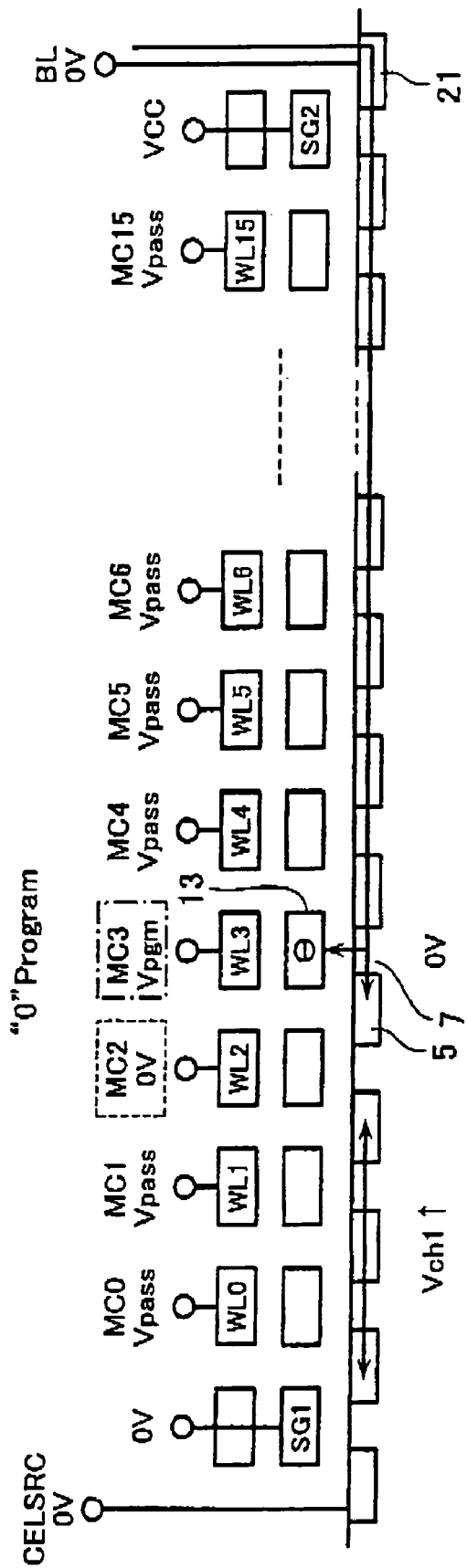
FIG. 12 is a diagram pictorially representing a NAND cell including a "0" written memory cell in an improved example 2.
Figure 13:
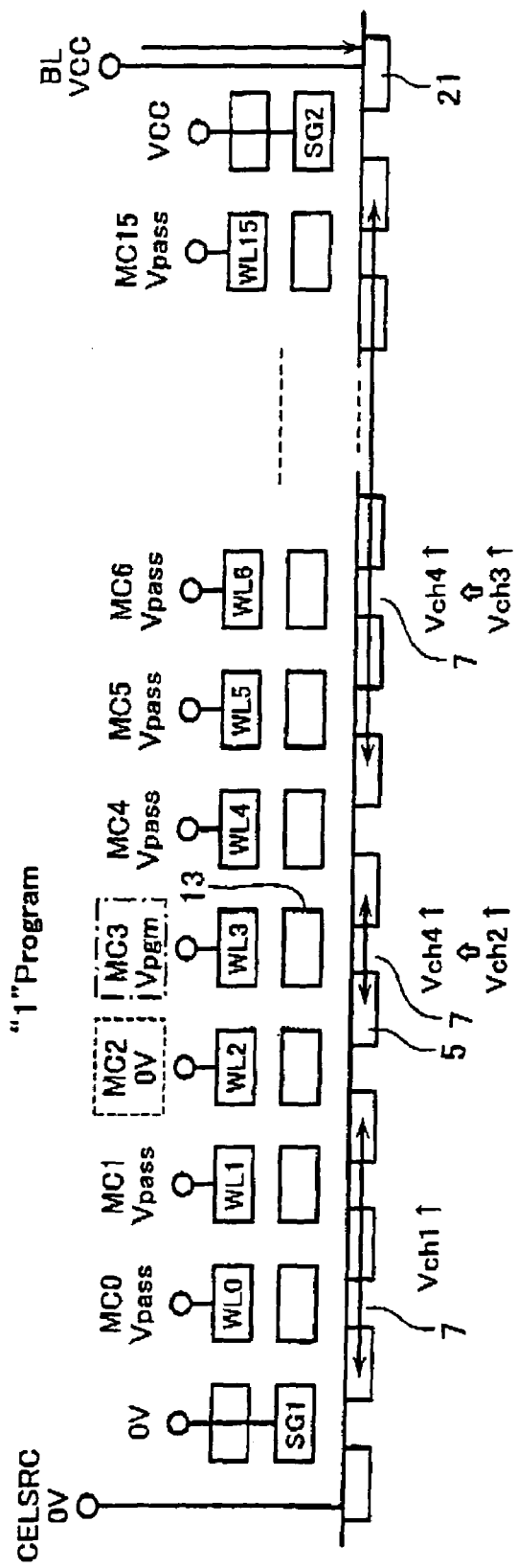
FIG. 13 is a pictorial diagram of a NAND cell including a "1" written memory cell in the improved example 2.
Figure 14:
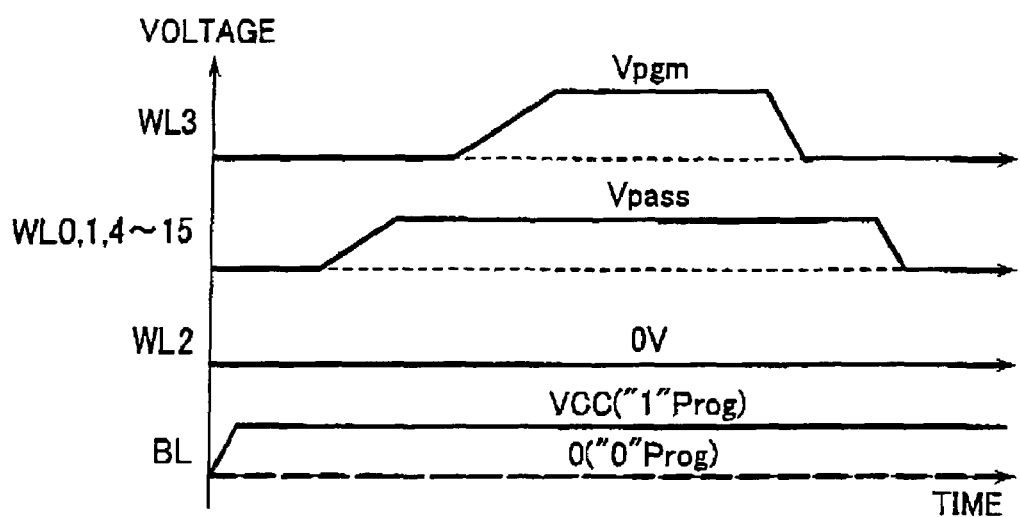
FIG. 14 is a timing chart for explanation of a write operation of the improved example 2.

Below is an explanation concerning the improved example 2 while focussing on differences from the improved example 1 by use of drawings. FIG. 12 is a pictorial representation of a NAND cell which includes a "0"-written memory cell in the improved example 2, which corresponds to FIG. 9. FIG. 13 shows a case where "1" write or programming is performed, which corresponds to FIG. 10. FIG. 14 is a timing chart for explanation of write operations of them, which corresponds to FIG. 11.

A "0" program operation of the improved example 2 is similar to the "0" program of the improved example 1 as has been set forth in FIG. 9, except that a word line WL4 performs the same operation as the word lines WL0–1 and WL5–15 as shown in FIGS. 12 and 14.

On the other hand, as shown in FIGS. 13–14, a "1" program operation of the improved example 2 also is such that the word line WL4 performs the same operation as the word lines WL0–1 and WL5–15. Whereby, the operation of (a) of ("1" Write) of the improved example 1 is such that in the improved example 2, either one of the memory cells MC2 and MC4—here, memory cell MC2—is driven to cut off.

And in the improved example 2, (b) of ("1" Write) of the improved example 1 becomes as follows. Regarding the channel region 7 of memory cell MC3, its both-side channel regions potentially rise up to Vch1 and Vch3 respectively. With such potential rise-up, a portion of the channel region 7 of memory cell MC3 which is on the common source line CELSRC side is charged up Vch2, which is about the significance |Vth|, a magnitude with a voltage drop of the larger threshold voltage of the memory cells MC2, 3, whereas a portion on the bit line BL side is potentially boosted due to the capacitive coupling to reach a potential level of Vch3.

Additionally, (c) of ("1" Write) of the improved example 2 is described below. A result of setting the voltage of word line WL3 at Vpgm (20V), the potential of the channel region 7 of memory cells MC3 to MC15 becomes the same (Vch2=Vch3) and goes up to Vch4 (around 8V for example). Whereby, the potential difference between the word line WL3 and the channel region 7 of memory cell MC3 becomes smaller. Thus, any electron injection due to tunnel current no longer occurs at the floating gate 13 of memory cell MC3, Hence, the threshold voltage of memory cell MC3 is held in the negative state ("1" written state).

(4) NAND CELL OPERATION EXAMPLE OF FIRST EMBODIMENT

In a first embodiment, set a word line WL1 at 0V, unlike the improved example 2 of FIGS. 12–13 which sets the word line WL2 at 0V. This is aimed at reduction of coupling noises. First, this noise problem will be explained.

Owing to advances in microfabrication technologies, the distance between word lines of semiconductor memory devices is becoming shorter. Nonvolatile semiconductor memory devices among semiconductor memory devices are such that a relatively high voltage is supplied to word lines during operations thereof. Due to this, when a word line significantly changes or swings in potential with an increased amplitude, its neighboring word lines on the both sides also increase in voltage variation due to the presence of capacitive coupling between the word lines. This is called the coupling noise.

Next, an explanation will be given of a write error or failure which results from the coupling noise. In the improved example 2 shown in FIG. 13, the voltage (Vpgm) of word line WL3 is larger than the voltage (Vpass) of word line WL0, 1. Accordingly, in order to prevent electrons from being injected to the floating gate 13 of the memory cell MC3 to be subjected to "1" program, it is required that Vch2 be larger than Vch1. In the improved example 2, the memory cell MC2 is driven to cut off, causing the channel 7 with its voltage of Vch1 to be separated from the channel 7 with the voltage Vch2.

In contrast, at the word line WL2 that is fixed to 0V, coupling noises take place upon potential rise-up of the word lines WL1 and WL3 respectively. Due to this noise generation, when the word line WL2 potentially rises up, the memory cell MC2 fails to cut off resulting in leakage of electrons of the channel 7 with the voltage Vch2. If the leakage electrons are great in number, Vch2 decreases causing the potential difference between Vch2 and word line WL3 to increase accordingly. As a result, electrons are injected into the floating gate 13 of memory cell MC3, causing the memory cell MC3 to become higher in threshold voltage. When the electrons being injected increase in number, the cell becomes in the "0" write state (write error).

Figure 15:
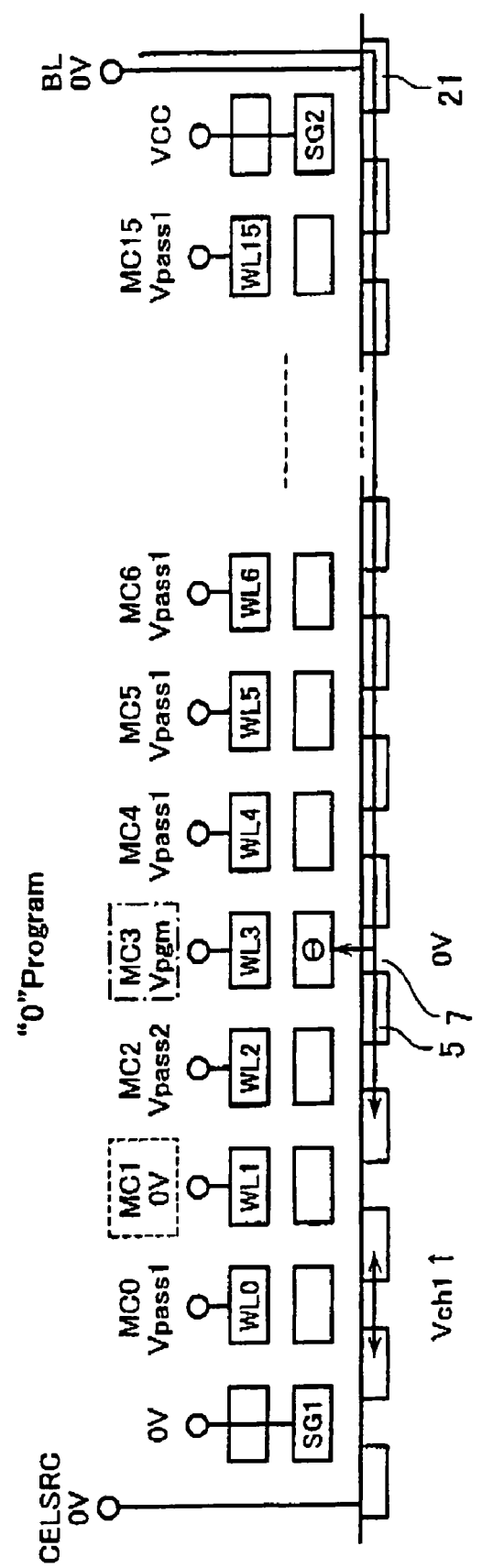
FIG. 15 is a diagram pictorially illustrating a NAND cell including a "0" written memory cell in the first embodiment.
Figure 16:
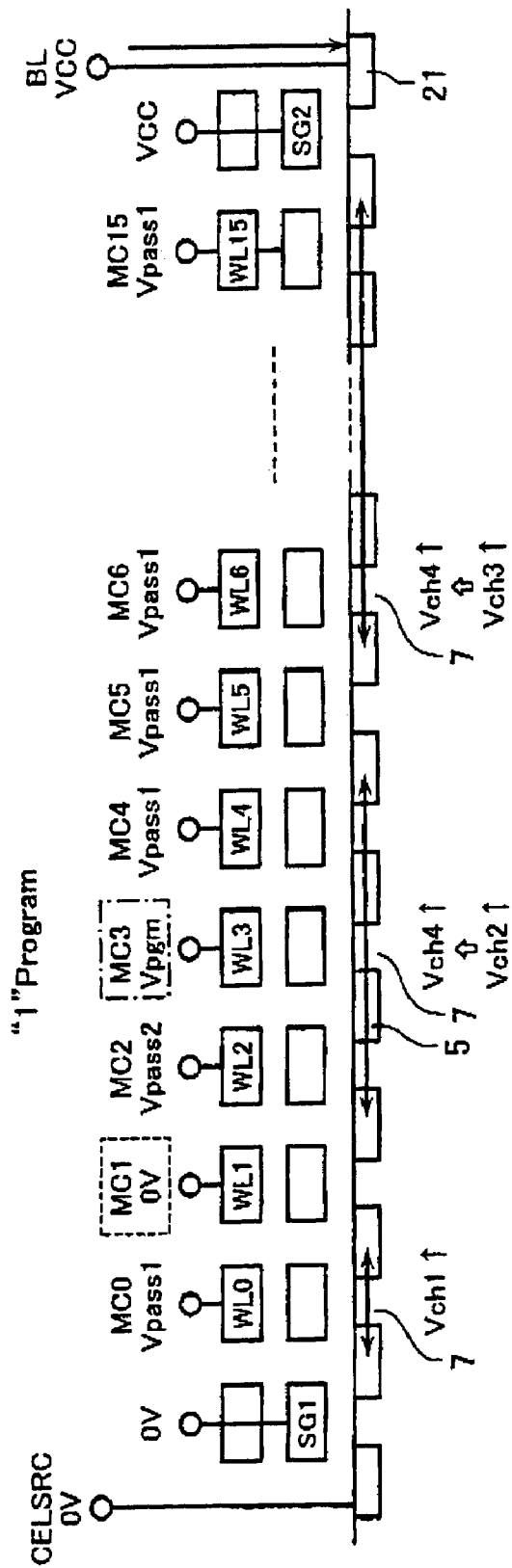
FIG. 16 is a pictorial diagram of a NAND cell including a "1" written memory cell in the first embodiment.
Figure 17:
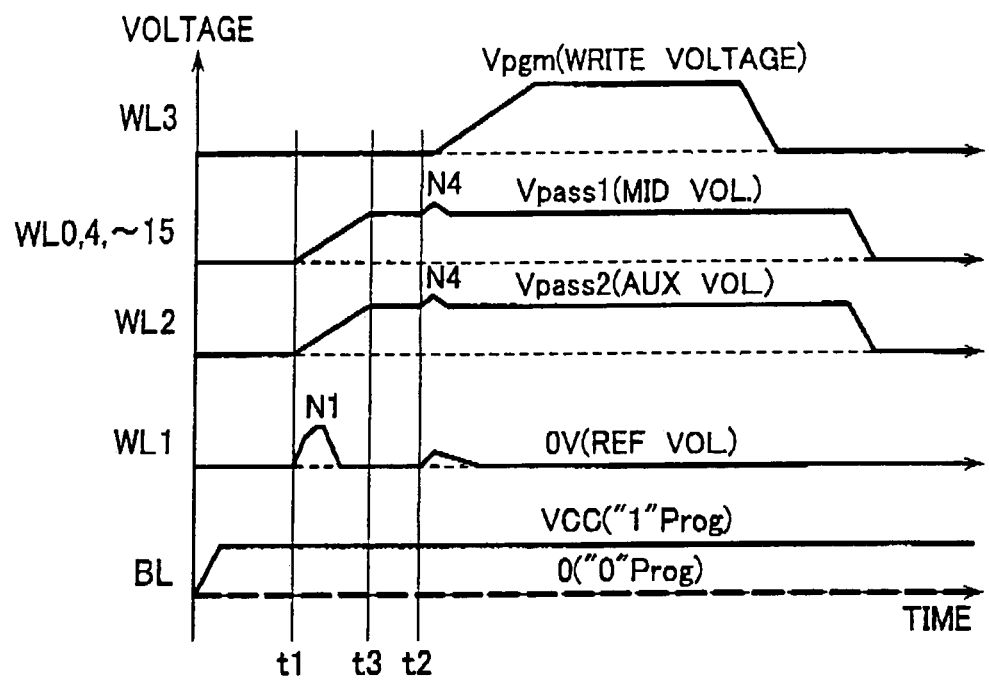
FIG. 17 is a timing chart for explanation of a write operation of operation examples of the first embodiment.

According to an operation example of the first embodiment to be next explained, it is possible to avoid write errors otherwise occurring due to coupling noises. The operation example of the first embodiment will be set forth with reference to FIGS. 15–17. FIG. 15 is a pictorial representation of a NAND cell which includes a "0"-written memory cell, which corresponds to FIG. 12. FIG. 16 shows an event that "1" write is performed, which corresponds to FIG. 13. FIG. 17 is a timing chart for explanation of a write operation out of operation examples of the first embodiment, which corresponds to FIG. 14.

Note here that a write or "program" voltage as used herein is a voltage which is supplied to the word line of a selected memory cell in order to write data into this memory cell. A reference voltage is a voltage that is supplied to the word line of a memory cell in order to cause this memory cell to cut off. An auxiliary voltage is a voltage which is supplied to the word line of a memory cell that is located between the above-noted selected memory cell and the memory cell to be cut off, and which is less in potential than the program voltage. An intermediate voltage, also called the mid-level voltage, is a voltage which is potentially midway between the voltage being supplied to the remaining word lines and the reference voltage.

For example, the program voltage is set at 20V. The mid-level voltage is 10V. The auxiliary voltage is at a potential level same as that of the mid voltage or is alternatively a voltage that is lower than the program voltage and yet higher than the power supply voltage. The reference voltage is greater than or equal in potential to ground potential (0V) and yet less than the auxiliary voltage.

As shown in FIGS. 15–17, the first embodiment is different from the comparative example 2 in that the reference voltage of 0V is supplied to word line WL1 and that an auxiliary voltage Vpass2 is supplied to word line WL2. At the time of "1" programming, in the first embodiment, the following voltage application is performed: the program voltage Vpgm is supplied to the word line (WL3 in FIG. 16) of a memory cell which is selected for data write; the reference voltage of 0V is applied to the word line (WL1 in FIG. 16) of a memory cell that is located closer to the common source-line side from this selected memory cell by a distance equivalent to two cells; the auxiliary voltage Vpass2 is applied to the word line (WL2 in FIG. 16) of a memory cell that is positioned between this memory cell residing closer by two cells to the common sourceline side and the above-noted selected memory cell; and, the mid-level voltage Vpass1 is supplied to the word lines (WL0 and WL4–15 in FIG. 16) of the remaining memory cells, respectively.

Accordingly, the mid voltage Vpass1 and the auxiliary voltage Vpass2 are supplied to the word lines of the neighboring memory cells (MC0 and MC2 in FIG. 16) on the both side of the memory cell (MC1 in FIG. 16) to be cut off, respectively. Hence, in the first embodiment, the program voltage Vpgm that is a high voltage is not supplied to the both-side neighboring memory cells of the memory cell to be cut off; thus, it is possible to reduce coupling noises otherwise occurring at the word line of such memory cell being cut off. This makes it possible to suppress a potential rise-up of the word line of the cutoff-required memory cell, thereby enabling successful execution of the cut-off operation with increased reliability. As a result, it is possible to prevent "0" programming from being performed at the time of "1" programming. As stated above, in accordance with the first embodiment, it is possible to avoid write errors even when the distance between word lines becomes shorter. In addition, owing to the reduction of coupling noises, it becomes possible to increase potential rise-up speeds or boost rates of the program voltage, the mid voltage and the auxiliary voltage whereby another advantage is also obtainable as to an ability to perform program operations at high speeds.

Figure 18:
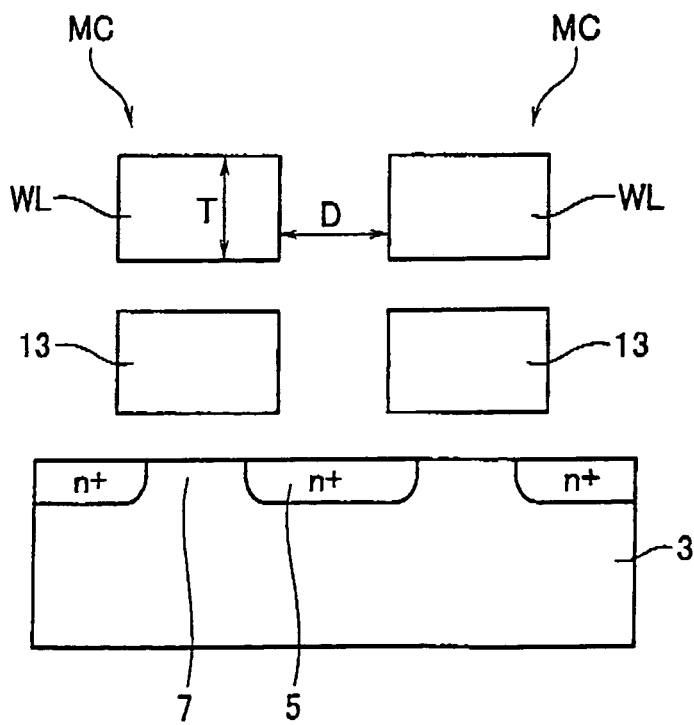
FIG. 18 is a pictorial diagram of neighboring memory cells in the first embodiment.

As shown in FIG. 18, especially in cases where the distance D between word lines is less than or equal to 90 nanometers (nm) or in case the ratio of a word line thickness T to wordline distance D is more than or equal to three (3), the risk of coupling noises becomes more appreciable. In these cases, the first embodiment becomes effective.

Also importantly, the first embodiment is applicable not only to schemes for letting a single memory cell store one bit of data ("0" or "1") but also to schemes (multi-value storage schemes) for permitting a memory cell to store therein multiple bits of data (for example, "00," "01," "10," or "11"). In the case of multi-value storage schemes, control is done in a single memory cell to make its threshold voltage different in a way pursuant to the data to be written, thereby realizing storage of multiple bits of data in a single memory cell. Hence, in the multivalue storage schemes, leakage can take place at the channel of a data-written memory cell, resulting in the memory-cell threshold-voltage control becoming more difficult when the memory cell becomes higher in threshold voltage. For this reason, the first embodiment is effective in particular in the case of multivalue storage schemes. This can also be said in the other embodiments as will be described later.

It should be noted that in the first embodiment, the auxiliary voltage Vpass2 is set at the same value as the mid-level voltage Vpass1 to thereby attain simplification of a wordline control circuit (FIG. 27) to be later explained. However, it is also permissible to make the auxiliary voltage Vpass2 different from the mid voltage Vpass1 in view of coupling noises or the like.

Second Embodiment

It is possible to obtain effects and advantages similar to those of the first embodiment stated supra in case the reference voltage is supplied to the word line of a memory cell which is located relatively closer to the common source-line side by a distance equivalent to N cells (N is an integer more than or equal to 2) from a selected memory cell. In the first embodiment, a case where N is 2 is stated. A case where N is 3 will be explained in a second embodiment below.

Figure 19:
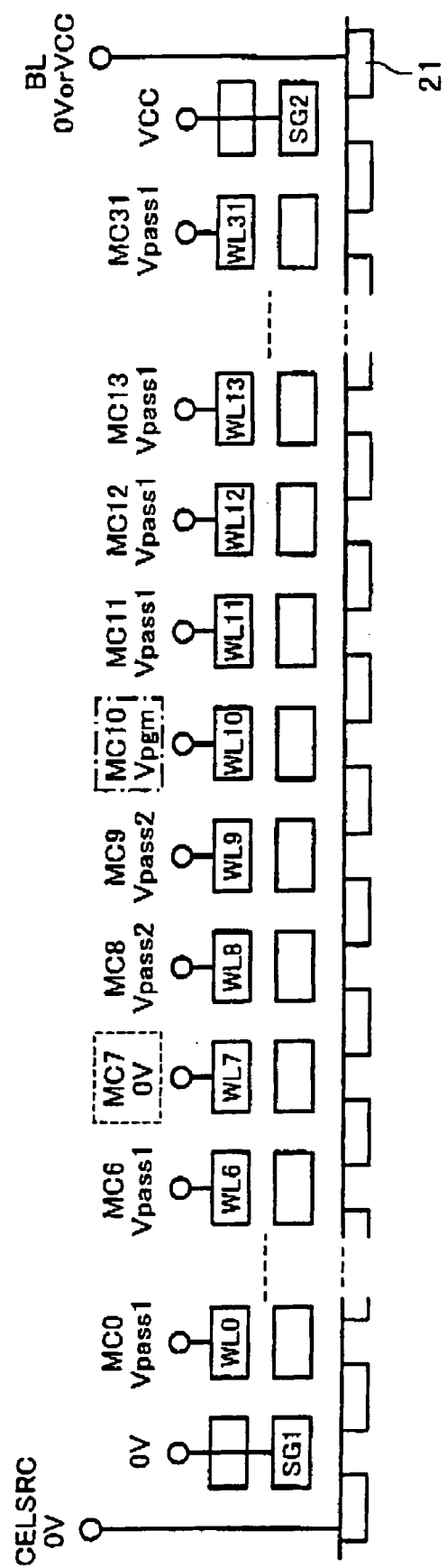
FIG. 19 is a pictorial diagram of a NAND cell including memory cells subjected to "0" and "1" write in a second embodiment.
Figure 20:
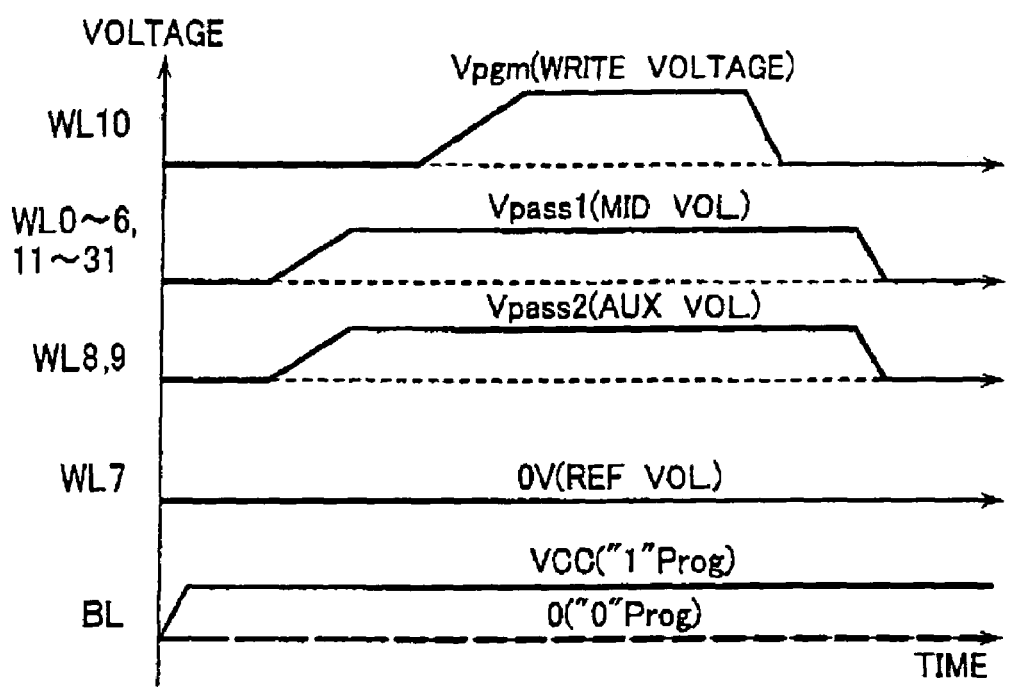
FIG. 20 is a timing chart for explanation of a write operation of operation examples of the second embodiment.

FIG. 19 is a pictorial representation of a NAND cell which includes memory cells into which "0" and "1" are written. FIG. 20 is a timing chart for explanation of a write operation out of operation examples of the second embodiment.

The number of memory cells making up the NAND cell 1 is thirty two (MC0 to MC31), for example. The program voltage Vpgm is supplied to the word line WL10 of a memory cell MC10. The reference voltage of 0V is supplied to the word line WL7 of a memory cell MC7 which is positioned adjacent to the common source-line CELSRC side from this memory cell MC10 by a distance equivalent to three cells. The auxiliary voltage Vpass2 is supplied to the word lines WL8 and WL9 of memory cells MC8–9 which are located between the memory cell MC7 and the memory cell MC10. The mid-level voltage Vpass1 is applied to the remaining word lines WL0–6 and WL11–31.

As the miniaturization of memory cells advances, the channels of such memory cells decrease in capacitance. Due to this, upon leakage of electrons from the channel of a memory cell that is subjected to "1" programming, this channel becomes larger in amount of potential decrease or drop-down. Hence, the risk of erroneous "0" programming increases accordingly. In the second embodiment, letting N be 3 makes it possible to increase in number those memory cells (MC8–9 in FIG. 19) which are between a selected memory cell (MC10 in FIG. 19) and the memory cell to be cut off (MC7 in FIG. 19), when compared to the first embodiment. Thus it is possible to increase the number of memory cells having channels connected to the selected memory cell—in other words, it is possible to increase the capacitance values of the channels as connected to the channel of the selected memory cell. Due to this, it is possible to lessen the potential drop-down amount of the above-noted channel to thereby enable prevention from occurrence of write errors.

Although in the second embodiment the explanation above assumes the cell number is three (3), the value of N may also be made larger than 3 since the number of memory cells making up the NAND cell 1 can be increased.

Third Embodiment

Figure 21:
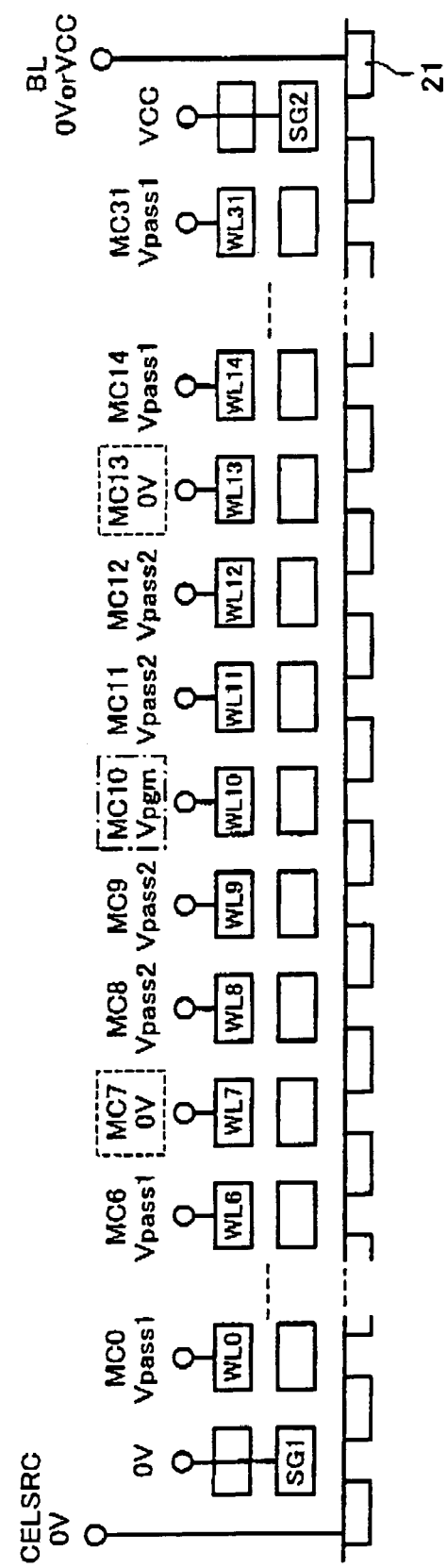
FIG. 21 is a pictorial representation of a NAND cell including memory cells subjected to "0" and "1" write in a third embodiment.

FIG. 21 is a pictorial representation of a NAND cell including memory cells into which "0" and "1" are written, which corresponds to FIG. 19 of the second embodiment. A third embodiment is the one that permits the reference voltage of 0V to be supplied to the word line WL13 of a memory cell MC13 in the structure of FIG. 19. More specifically, the reference voltage is supplied to the word lines of certain memory cells which are placed closer to the common sourceline side and the bitline side respectively by a distance corresponding to three cells from a selected memory cell. Note that the program voltage Vpgm is supplied to the word line of the selected memory cell stated above. The auxiliary voltage Vpass2 is supplied to the word lines of those memory cells that are located between the selected memory cell and the memory cell at the position of N cells. The mid-level voltage Vpass1 is fed to the word lines of the remaining memory cells.

For the same reason as the first embodiment, it becomes possible for the third embodiment to reduce coupling noises otherwise occurring at the word lines (WL7 and WL13 in FIG. 21) of the memory cells to be cut off (MC7 and MC13 in FIG. 21). Thus it is possible to prevent "0" programming from being erroneously performed to a memory cell that is to be subjected to "1" program.

As in the second embodiment, the third embodiment also becomes effective for decreases in channel capacitances of memory cells occurring due to the miniaturization of such memory cells. Note that although in the third embodiment the explanation was given under an assumption that the cell number N is 3, it is also possible to make the value of N larger than 3.

Fourth Embodiment

Figure 22A:
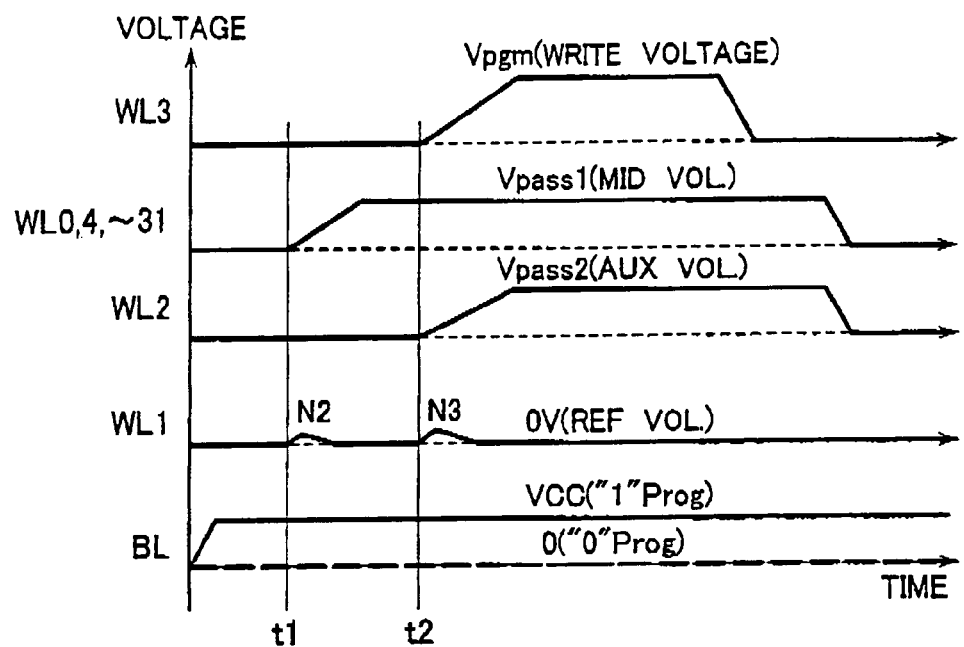
FIGS. 22A and 22B are timing charts for explanation of a write operation of operation examples of a fourth embodiment.

FIG. 22A is a timing chart for explanation of a write operation out of operation examples of a fourth embodiment, which corresponds to FIG. 17 of the first embodiment. The fourth embodiment is different from the first embodiment in that the timing for supplying the auxiliary voltage is delayed so that it comes after the timing for supplying the mid-level voltage. Explaining this point illustratively, the first embodiment is such that the auxiliary voltage is designed to start up its potential rise-up at time point t1, simultaneously when the mid voltage rises up in potential. In contrast, in the fourth embodiment, the potential rise-up of the mid voltage gets started at time point t1; thereafter, with a certain delay, the potential riseup of the auxiliary voltage gets started at time point t2. This brings effects and advantages which follow.

(a) In the first embodiment, the neighboring word lines (WL0 and WL2 in FIG. 17) on the both sides of a word line to which the reference voltage is supplied are driven to potentially rise up simultaneously. The reference voltage-supplied word line receives the capacitive coupling influences from the both-side neighboring ones at the same time so that a relatively large coupling noise N1 takes place.

In contrast, the fourth embodiment is arranged to first perform potential raise-up of one of the neighboring word lines on the both sides of the reference voltage-supplied word line which is the word line (WL0 in FIG. 22A) to which the mid-level voltage is supplied, and then, with a time delay, potentially raise up the word line (WL2 in FIG. 22A) to which the auxiliary voltage is supplied.

In this way, in the fourth embodiment, the auxiliary voltage and the mid-level voltage are made different from each other in voltage supply timing by letting the auxiliary voltage be slower in supply timing than the mid voltage. With such an arrangement, a time difference is forced to occur in potential rise-up events of the neighboring word lines which are located on the both sides of the word line to which the reference voltage is supplied. Accordingly, the coupling noise that the reference voltage-supplied word line is expected to receive from its both-side neighboring word lines is dispersed into noise components N2 and N3. Thus it is possible for the fourth embodiment to suppress a potential rise-up of the reference voltage-supplied word line in comparison with the first embodiment. As a result, it is possible to avoid the risk that "0" programming is erroneously performed to the memory cell MC which should be subjected to "1" programming.

(b) For instance, as shown in FIG. 17, it sometime happens that the potential rise-up of a word line to which the write or program voltage is supplied results in generation of a coupling noise N4 on a word line to which the auxiliary voltage is supplied. Whereby, there is a risk that the auxiliary voltage-supplied word line rises up in potential, which leads to occurrence of a write error or failure at a memory cell (MC2) having this word line. Prior to completion of the potential rise-up of the auxiliary voltage-supplied word line, the influenceability of the riseup of the program voltage-supplied word line stays less when compared to after completion thereof.

In the first embodiment of FIG. 17, after having completed (at time point t3) the potential rise-up of the auxiliary voltage-supplied word line, the potential riseup of the program voltage-supplied word line gets started (at time t2). In contrast, in the fourth embodiment of FIG. 22A, potential riseup of the auxiliary voltage-supplied word line and that of the program voltage-supplied word line get started simultaneously (at time t2). More specifically, prior to completion of potential riseup of the auxiliary voltage-supplied word line, the program voltage-supplied word line starts its potential riseup. Thus it is possible to suppress unwanted potential increase of the auxiliary voltage-supplied word line, when compared to the first embodiment of FIG. 17.

Figure 22B:
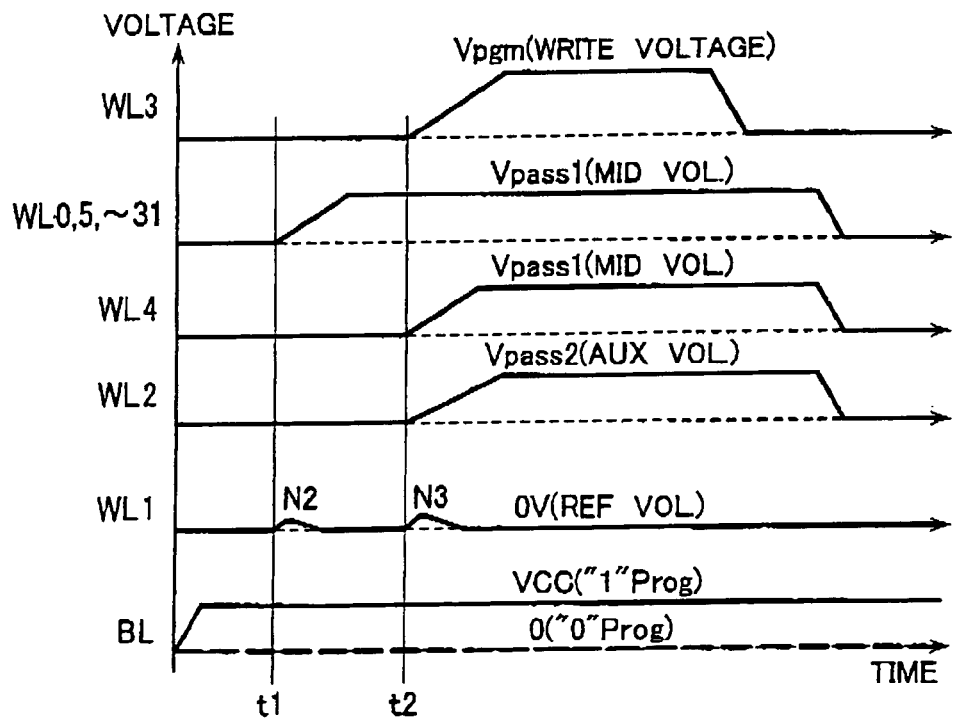

The same can also be said with respect to one of the neighboring word lines on the both sides of the word line (WL3) of a selected memory cell, which is the bitline side neighboring word line (WL4) that is a word line on the bitline side. Accordingly, as shown in FIG. 22B, it is preferable to perform potential riseup of this word line at the same time when the auxiliary voltage-supplied word line (WL2) and the program voltage-supplied word line (WL3) potentially rise up (at time point t2).

(c) Note that the fourth embodiment is arranged in a similar way to the first embodiment so that word lines (WL0 and WL2 in FIG. 22A) which are next to the reference voltage-supplied word line on the both sides thereof are supplied with either the mid-level voltage or the auxiliary voltage, rather than the program voltage. Hence, as in the first embodiment, it becomes possible to reduce coupling noises otherwise occurring at the reference voltage-supplied word line (that is, the word line of a memory cell to be cut off). Thus it is possible to prevent "0" program from being done at the time of "1" programming. Another advantage is that this coupling noise reduction makes it possible to increase the potential rise-up speeds of the program voltage and auxiliary voltage, which in turn enables achievement of high-speed write/programming operations.

(d) The fourth embodiment is arranged to delay the timing for supplying the auxiliary voltage so that it comes after the timing for supplying the mid-level voltage while at the same time supplying the reference voltage to a word line at an earlier time than the auxiliary voltage and the mid voltage. With such an arrangement, it is possible to suppress leakage at any memory cell having the word line to which the reference voltage is supplied (i.e. the memory cell to be cut off). A detailed explanation will be given below.

First, the mid-level voltage is supplied to one of the neighboring word lines located on the both sides of a word line to which the reference voltage is supplied, which is the word line (WL0 in FIG. 22A) that is located next thereto on one side. Whereby, the source voltage of a memory cell having the reference voltage-supplied word line is caused to potentially rise up due to the presence of capacitive coupling. Next, the auxiliary voltage is supplied to the other neighboring word line (WL2 in FIG. 22A). Whereby, the drain voltage of a memory cell having the reference voltage-supplied word line is driven to rise up in potential. However, since the above-noted source voltage is potentially raised or boosted, it is possible to restrain leakage of from the drain to the source. Hence, it becomes possible to prevent write errors.

(e) The fourth embodiment is such that the auxiliary voltage-supplied word line and the program voltage-supplied word line are driven to potentially rise up simultaneously. Due to this, it becomes easier to control word lines.

Fifth Embodiment

Figure 23A:
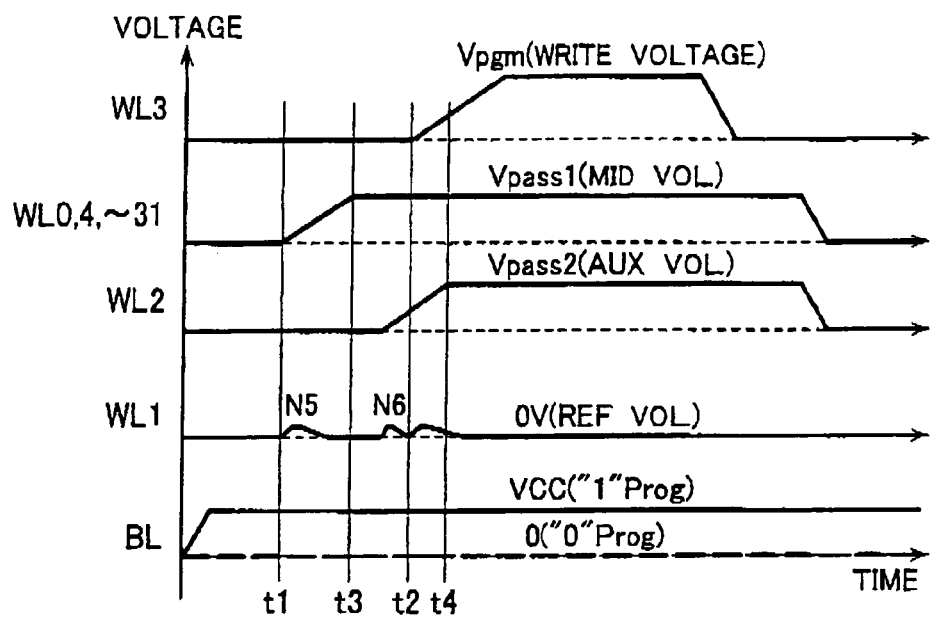
FIGS. 23A and 23B are timing charts for explanation of a write operation in accordance with a fifth embodiment.

A fifth embodiment will be explained while mainly focussing on its differences from the fourth embodiment. FIG. 23A is a timing chart for explanation of a write operation in accordance with the fifth embodiment. Prior to completion of the potential rise-up of a word line to which the auxiliary voltage is supplied (at time point t4), start potential riseup of a word line to which the write or program voltage is supplied (at time t2). Due to this, it is possible to suppress or restrain any unwanted potential increase of the auxiliary voltage-supplied word line, as has been stated in the paragraph (b) of the fourth embodiment.

Figure 23B:
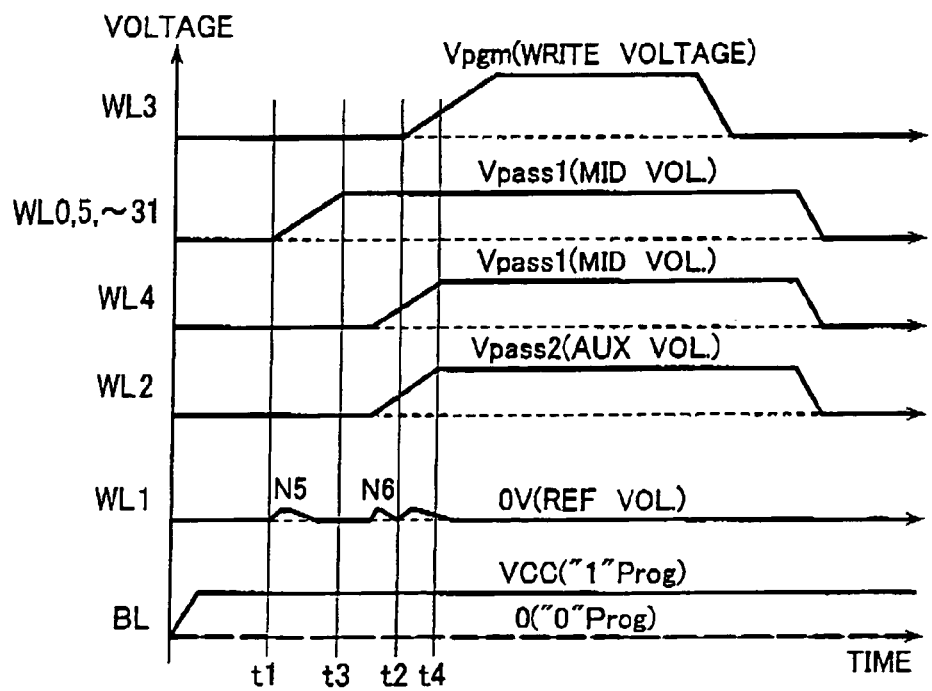

The same can also be said with respect to the bitline side neighboring word line (WL4) which is a word line on the bitline side and which is one of the neighboring word lines located next to the word line (WL3) of a selected memory cell. Accordingly, as shown in FIG. 23B, it is preferable that the potential riseup of this word line be done at the same time that the auxiliary voltage-supplied word line (WL2) potentially rises up (at time point t2).

According to the fifth embodiment, it is possible to achieve the effects (a) to (d) of the fourth embodiment stated supra. Also note that in the fifth embodiment, the reference voltage-supplied word line is such that the coupling noise received from its both-side neighboring word lines is dispersed into noise components N5 and N6 (in FIG. 22, N2 and N3).

Sixth Embodiment

Figure 24A:
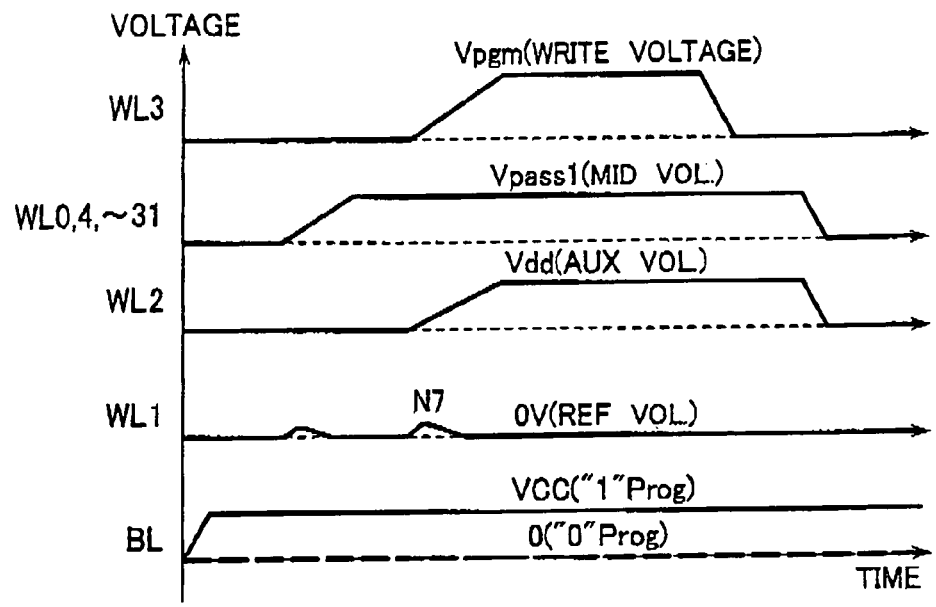
FIGS. 24A–24B are timing charts for explanation of a write operation in accordance with a sixth embodiment.
Figure 24B:
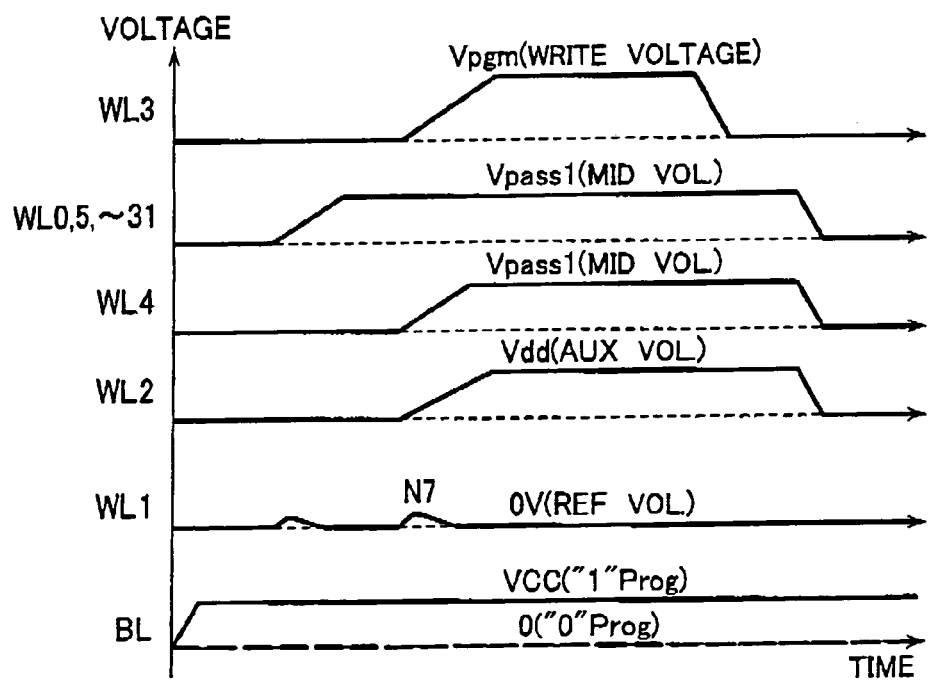

FIGS. 24A and 24B are timing charts for explanation of a write operation in accordance with a sixth embodiment. FIG. 24A corresponds to FIG. 22A, and FIG. 24B corresponds to FIG. 22B. A difference from the fourth embodiment shown in FIG. 22 is that a power supply voltage Vdd (for example, 5V) less than Vpass2 (e.g. 10V) is used as the auxiliary voltage. Thus, it is possible to make a noise N7 being generated at the reference voltage-supplied word line smaller than the noise N3 of FIG. 22.

Seventh Embodiment

Figure 25A:
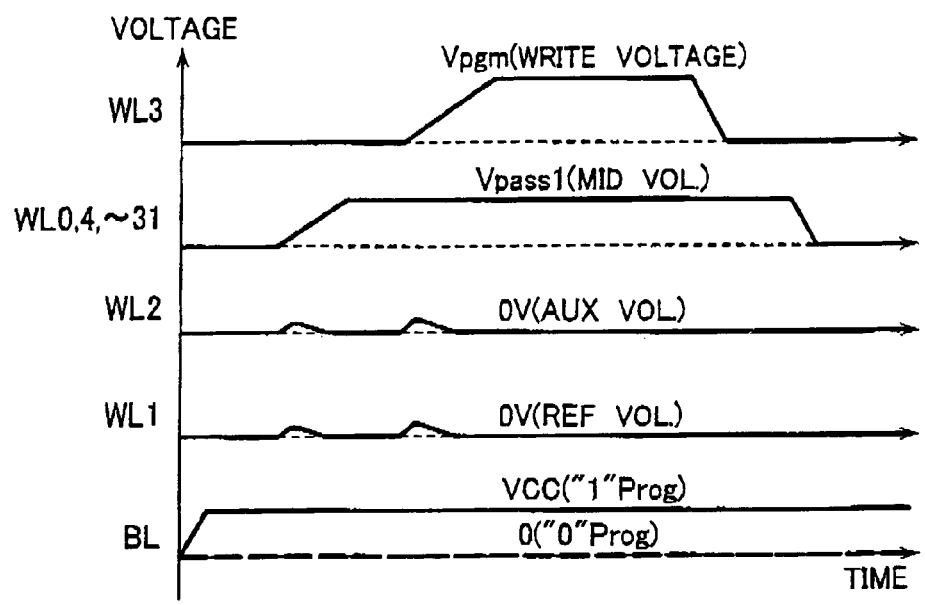
FIGS. 25A–25B are timing charts for explanation of a write operation in accordance with a seventh embodiment.
Figure 25B:
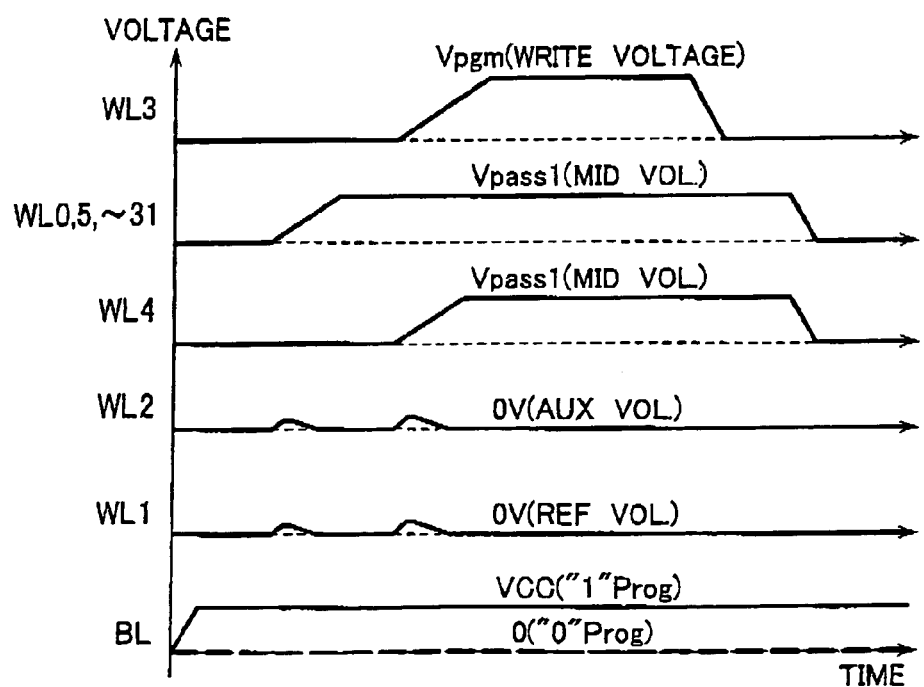

A seventh embodiment will be explained. FIGS. 25A and 25B are timing charts for explanation of a write operation in accordance with this embodiment. FIG. 25A corresponds to FIG. 22A, and FIG. 25B corresponds to FIG. 22B. A difference from the fourth embodiment of FIG. 22 is that the auxiliary voltage is set at ground potential of 0V, rather than at Vpass2 (for example, 10V). Setting the auxiliary voltage at 0V results in the word line's potential variation becoming almost no longer occurrable. Thus it is possible to reduce the coupling noise of word line WL2.

Eighth Embodiment

The embodiments stated above are such that the auxiliary voltage with the same significance is applied to each of the word lines of N−1 memory cells which are located between a selected memory cell and a memory cell that is at an N-cell position and has its word line to which the reference voltage is supplied. In contrast, in an eighth embodiment, the voltage may be set at a different value or alternatively at the same value. In addition, in the previous embodiments, the intermediate or "mid" voltage is applied to all of those word lines excluding the word lines to which the write voltage, reference voltage and auxiliary voltage are applied. In the eighth embodiment the mid voltage is supplied to at least one word line.

Figure 26:
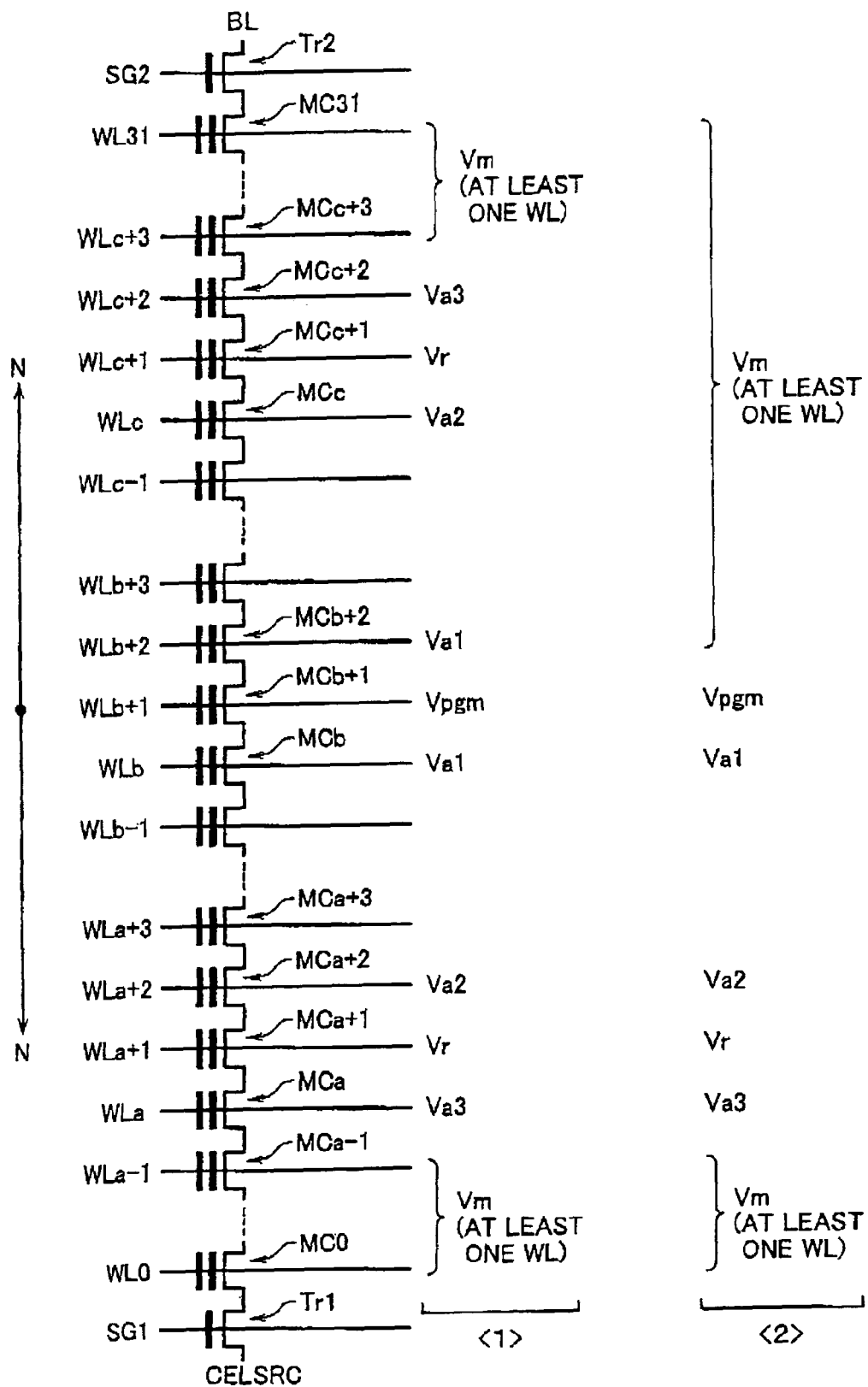
FIG. 26 is an equivalent circuit diagram of a NAND cell for explanation of voltages to be applied to respective word lines in an eighth embodiment.

A detailed explanation will be given of the eighth embodiment below. FIG. 26 is an equivalent circuit diagram of a NAND cell for explanation of voltages to be applied to respective word lines in the eighth embodiment. In the eighth embodiment, the voltage application scheme includes a first and a second method.

The first method is such that as indicated by <1> in FIG. 26, a write voltage Vpgm is supplied to a word line WLb+1 of a selected memory cell MCb+1. A reference voltage Vr is applied to word lines WLa+1 and WLc+1 of certain memory cells that are placed on the common source line CELSRC side and on the bitline BL side while being spaced apart from the memory cell MCb+1 by a distance corresponding to N cells (N is an integer greater than or equal to 2). A first auxiliary voltage Va1 that is less than the write voltage Vpgm is applied to word lines WLb, WLb+2 of memory cells MCb, MCb+2 which are located on the both neighboring sides of the memory cell MCb+1.

A second auxiliary voltage Va2 and a third auxiliary voltage Va3, each of which is less than the write voltage Vpgm, are supplied to word lines WLa+2 and WLa of memory cells MCa+2 and MCa that are positioned on the both neighboring sides of the memory cell MCa+1, respectively. Similarly, the second auxiliary voltage Va2 and third auxiliary voltage Va3 are also applied to word lines WLc and WLc+2 of memory cells MCc and MCc+2 that are placed on the both neighboring sides of the memory cell MCc+1, respectively.

The mid voltage Vm is supplied to the word line of at least one memory cell of the remaining memory cells other than those memory cells which are positioned between a memory cells having its word line to which the first auxiliary voltage Va1 is supplied and a memory cell with its word line to which the second auxiliary voltage Va2 is applied. In other words, the mid voltage Vm is applied to the word line of at least one memory cell out of the memory cells MC0 to MCa−1, and the mid voltage Vm is given to the word line of at least one memory cell of the memory cells MCc+3 to MC31.

On the other hand, the second method is as follows. As shown by <2> in FIG. 26, none of the reference voltage Vr and the first to third auxiliary voltages Va1–Va3 are supplied to those memory cells that are positioned on the bitline side with respect to the selected memory cell MCb+1. The mid voltage Vm is applied to at least one of these memory cells.

Figure 27:
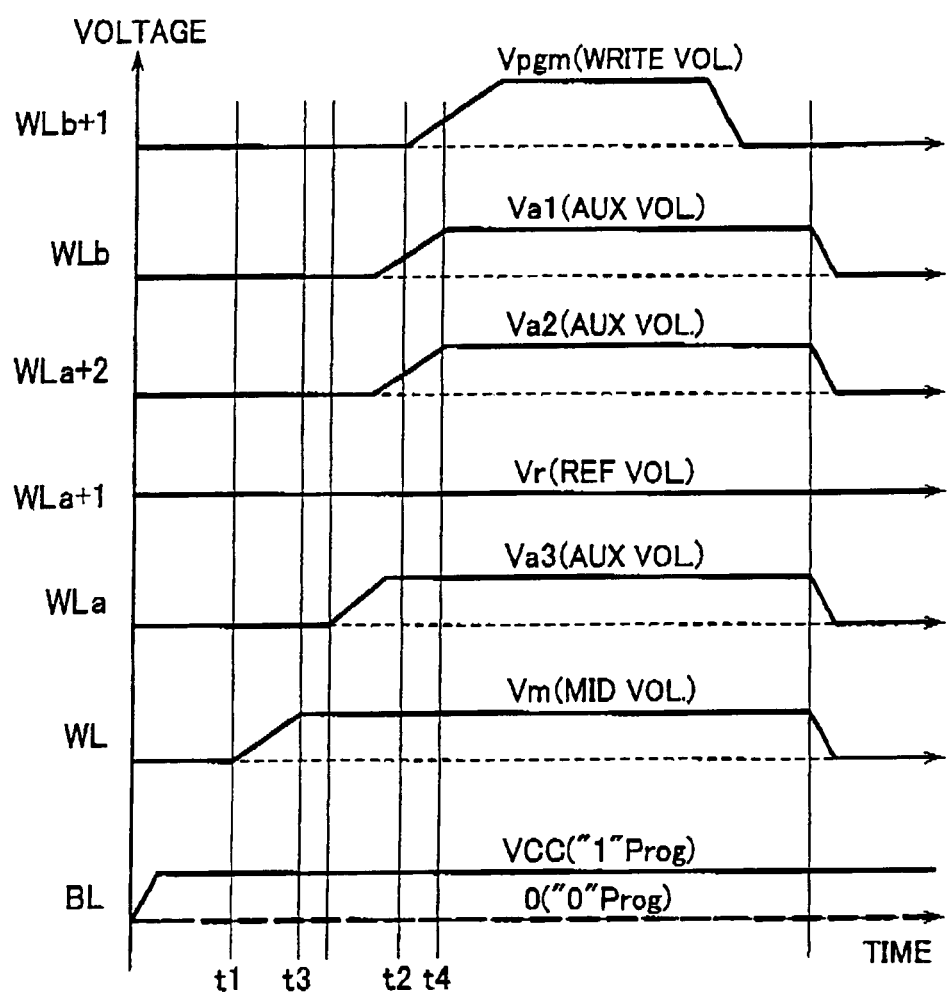
FIG. 27 is a timing chart for explanation of a write operation in accordance with the eighth embodiment.

FIG. 27 is a timing chart for explanation of a write operation in accordance with the eighth embodiment. This is the second method <2>. Voltages to be supplied to the word lines WLa+3 to WLb−1 are not recited herein. The voltages to be applied to these word lines may be designed to have appropriate magnitudes that preclude occurrence of any write failures. Effects and advantages of the eighth embodiment are substantially similar to those of a ninth embodiment to be described below so that these will be explained in the ninth embodiment.

Ninth Embodiment

Figure 28:
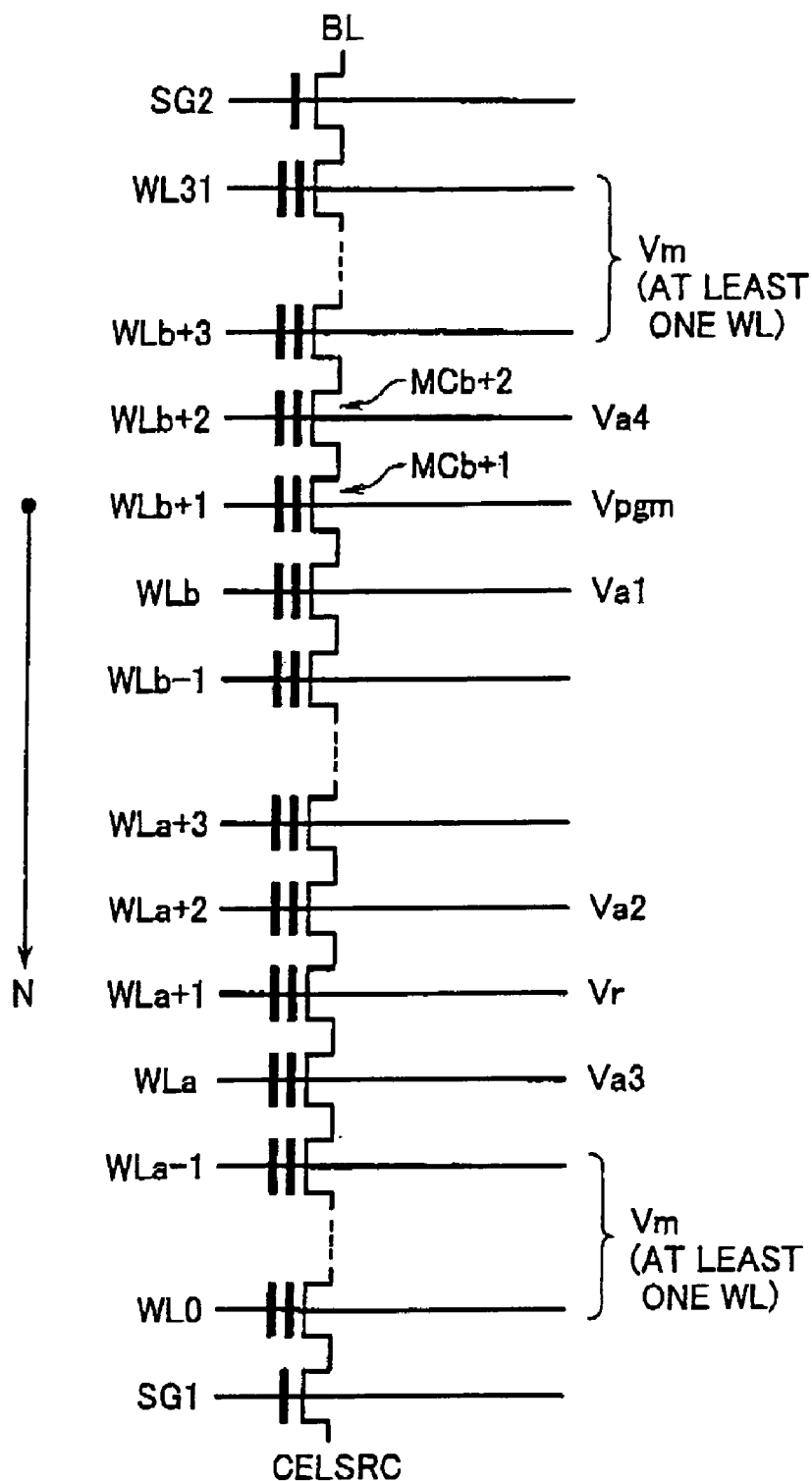
FIG. 28 is an equivalent circuit diagram of a NAND cell for explanation of voltages as applied to respective word lines in a ninth embodiment.
Figure 29:
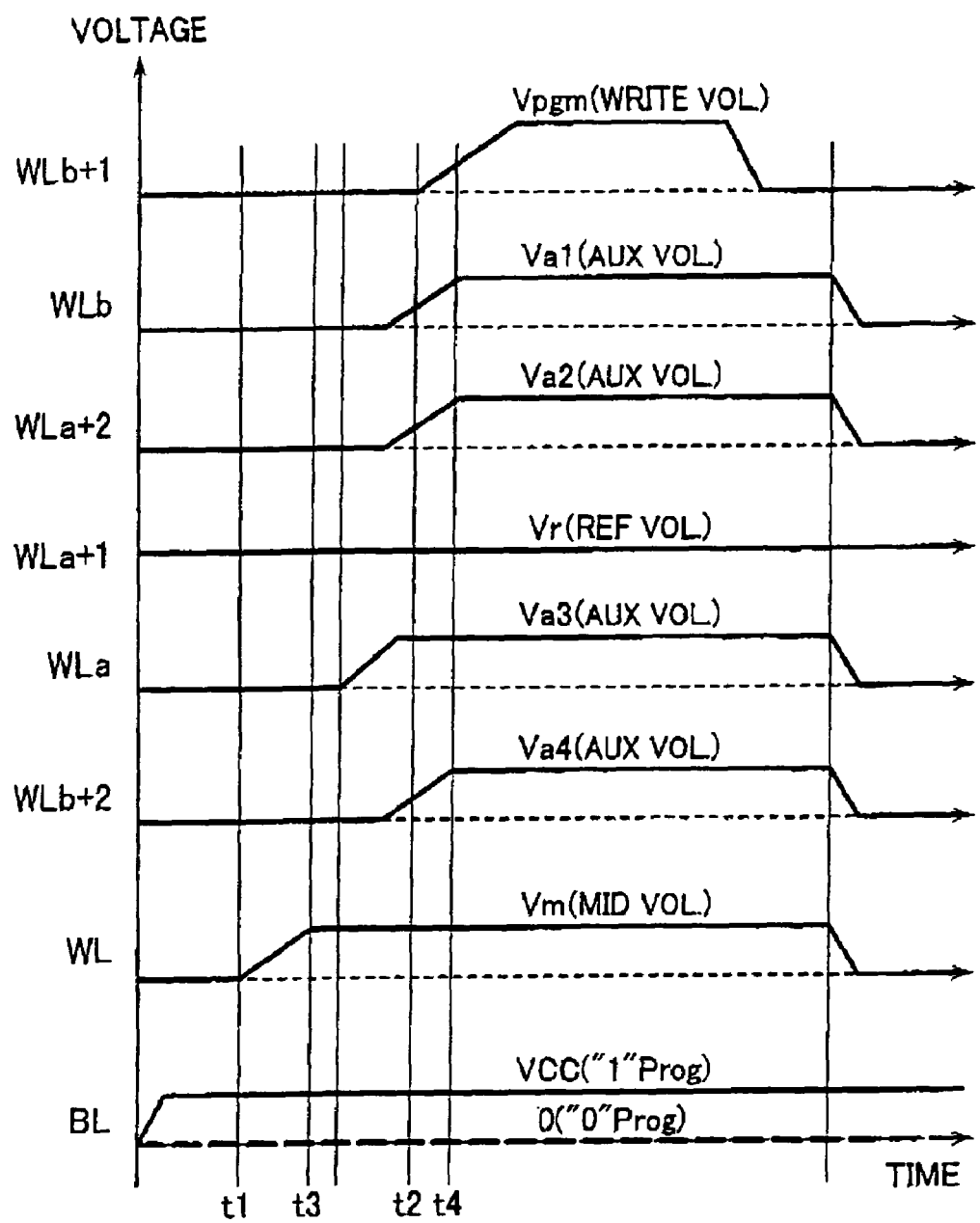
FIG. 29 is a timing chart for explanation of a write operation in accordance with the ninth embodiment.

FIG. 28 is an equivalent circuit diagram of a NAND cell for explanation of the voltages to be applied to respective word lines in the ninth embodiment, which diagram corresponds to FIG. 26. FIG. 29 is a timing chart for explanation of a write operation in accordance with the ninth embodiment, which corresponds to FIG. 27. The ninth embodiment is an improved version of the second method <2> of the eighth embodiment. More specifically, a fourth auxiliary voltage Va4 that is less than the write voltage Vpgm is supplied to the word line of one of the memory cells positioned on the both neighboring sides of a selected memory cell MCb+1, that is, the word line WLb+2 of the bitline BL side memory cell MCb+2.

Effects of the eighth embodiment and ninth embodiment will be explained with reference to FIGS. 26 and 27. The timing for supplying the second auxiliary voltage Va2 is made different from that of the third auxiliary voltage Va3. Accordingly, as has been explained in the fourth embodiment, a time difference takes place between the potential rise-up events of the word lines WLa and WLa+2 that are placed on the both neighboring sides of a word line WLa+1, to which the reference voltage Vr is supplied. As a result of this time difference, it is possible to disperse coupling noises occurring at the word line WLa+1.

The first to third auxiliary voltages Va1–Va3 (in the ninth embodiment, these are the first to fourth auxiliary voltages Va1–Va4; hereafter, parentheses correspond to the ninth embodiment) are designed so that the supply timings thereof are made later than that of the mid voltage Vm. In addition, the reference voltage Vr is made earlier in supply timing than the write voltage Vpgm, the first to third auxiliary voltages Va1–Va3 (first to fourth auxiliary voltages Va1–Va4) and the mid voltage Vm.

Prior to completion of the potential rise-up of the word line WLb (word lines WLb and WLb+2) to which the first auxiliary voltage Va1 (first and fourth auxiliary voltage Va1, Va4) is/are supplied, the riseup of the word line WLb+1 to which the write voltage Vpgm is supplied gets started. Whereby, as has been explained in Section (b) of the fourth embodiment, it is possible to suppress potential increase of the word line WLb (word lines WLb, WLb+2) to which the auxiliary voltage Va1 (auxiliary voltages Va1, Va2) is/are applied. Note here that similar results are obtainable when permitting simultaneous start-up of supplement of the word lines WLb and WLa+2 (word lines WLb, WLa+2 and WLb+2) to which the first and second auxiliary voltages Va1–Va2 (first, second and fourth auxiliary voltages Va1–Va2 and Va4) are supplied and the word line WLb+1 to which the write voltage Vpgm is applied.

For example, the first auxiliary voltage Va1 and others may be set at values which follow. The second auxiliary voltage Va2 is the power supply voltage or ground voltage. The first to third auxiliary voltages Va1–Va3 (first to fourth auxiliary voltages Va1–Va4) are less than the write voltage Vpgm and yet greater than the supply voltage. The first and third auxiliary voltages Va1 and Va3 (first, third and fourth auxiliary voltages Va1 and Va3–Va4) are the same as the mid voltage Vm. The reference voltage Vr is greater than or equal to the ground voltage and yet less than the second auxiliary voltage Va2.

Combination of Respective Embodiments

Figure 30:
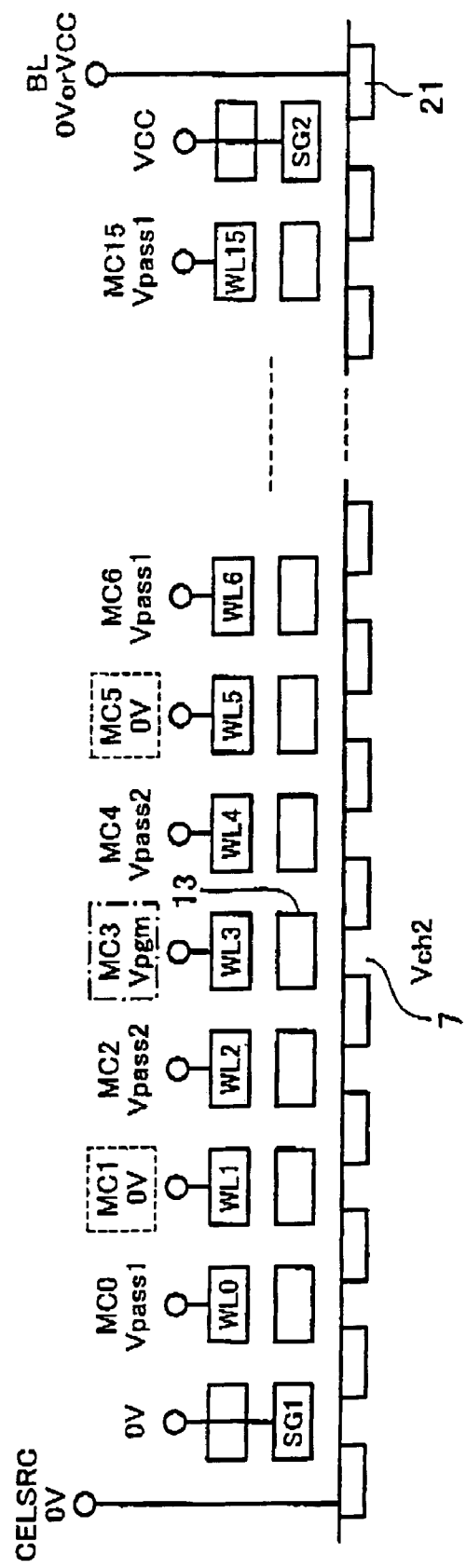
FIG. 30 is a diagram which shows a write scheme applicable to this embodiment and which is a pictorial representation of a NAND cell including "0"- and "1"-written memory cells.

The fourth to seventh embodiments are applicable also to the second or third embodiment and also applicable to a NAND cell of the type shown in FIG. 30. In the type shown in FIG. 30, the reference voltage of 0V is supplied to the memory cells MC1 and MC5 that are located closer to the common source line CELSRC side and the bitline BL side respectively by a distance equivalent to two cells from a selected memory cell MC3.

An advantage of the NAND cell of the type shown in FIG. 30 is as follows. In a "0" write or programming event, the voltages of the neighboring word lines WL2 and WL4 on the both sides of a word line WL3 to which the program voltage Vpgm is supplied are set at the auxiliary voltage Vpass2 so that the floating gate of memory cell MC2, MC4 potentially rises up due to the capacitive coupling. With this potential rise-up, the floating gate of the memory cell MC3 that is between the memory cells MC2 and MC4 also rises up in potential. Accordingly, writing to memory cell MC3 is accelerated, which in turn makes it possible to lower the voltage being supplied to the word line WL3.

On the other hand, in a "1" program event, the write error preventing effect is enhanced. More definitely, at the time of "1" programming, the potential of a channel region 7 of memory cell MC3 is forced to increase. However, due to a leakage current from the channel region 7 of memory cell MC3, this channel region 7 decreases in potential. If programming is simply continued in such potential drop-down state, then write error can occur. Thus, a time taken to apply a voltage to word line WL3 is limited from a viewpoint of the leakage current. In the cell type of FIG. 30, the potentials of the channel regions 7 of both-side neighboring memory cells MC2 and MC4 in addition to memory cell MC3 are set at Vch2, resulting in the lager capacitance of channel regions 7. Therefore the potential drop-down due to the leak current takes time; thus, it is possible to cause write errors to be hardly occurrable.

Circuit Blocks of Embodiment of the Invention

Figure 31:
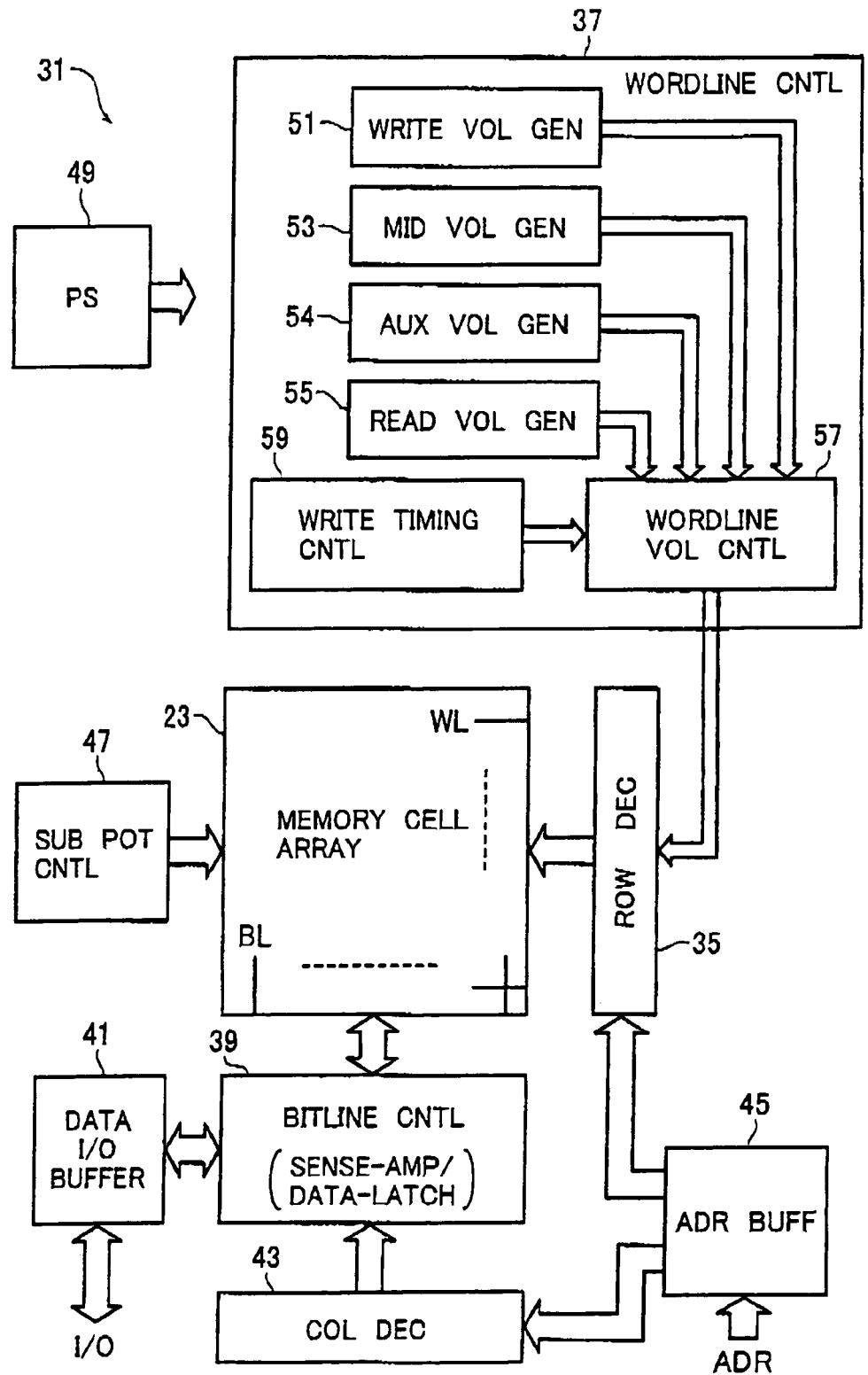
FIG. 31 is a block diagram showing an overall configuration of a NAND type EEPROM in accordance with an embodiment of this invention.

FIG. 31 is a block diagram showing an entire configuration of a NAND type EEPROM 31 in accordance with an embodiment of this invention. Each block making up the NAND-EEPROM 31 will be explained below. A memory cell array 23 has a structure in which NAND cells, each of which is similar to the NAND cell 1 of FIG. 3, are laid out and organized into a matrix form. A row decoder 35 is operable to perform selection control of word lines and select gate lines which are disposed in the memory cell array 23. A word-line control circuit 37 controls voltages and timings of the word lines and select gate lines. Regarding the wordline control circuit 37, a detailed explanation will be given later.

A bit-line control circuit 39 controls bit lines of the memory cell array 23 in order to perform data read, write pulse application, rewrite, write-verify-read and erase-verify-read operations. The bitline control circuit 39 includes a sense/latch circuit which has functions of a sense amplifier circuit and a data latch circuit. The bitline control circuit 39 is mainly made up of complementary metal oxide semiconductor (CMOS) flip-flops, and performs data latch for data writing and a sense operation for reading the potential of a bit line, or alternatively a sense operation in write-verify events, and further latching of rewrite data. The bitline control circuit 39 is such that data I/O is input and output through a data input/output buffer 41 while a signal is input from a column decoder 43.

Address signals ADR are input through an address buffer 45 to the column decoder 43 and row decoder 35 respectively. A substrate potential control circuit 47 controls the potential of a p-type substrate (or p-type well region) in which the memory cell array 23 is formed. A power supply circuit 49 supplies appropriate voltages, such as power supply voltage VCC and ground voltage, to the wordline control circuit 37 and substrate potential control circuit 47 or else.

Each block making up the wordline control circuit 37 will be explained in detail below. A write voltage generating circuit 51, an intermediate or mid-level voltage generating circuit 53, an auxiliary voltage generating circuit 54 and a read-use voltage generating circuit 55 generate a write or program voltage (Vpgm), a mid-level voltage (Vpass1), an auxiliary voltage (Vpass2), and a read voltage, respectively, based on the supply voltage VCC from the power supply circuit 49. A word-line voltage control circuit 57 generates, based on these voltages, the voltages to be supplied to the word lines and select gate lines (such as Vpgm, Vpass1, Vpass2, VCC, ground voltage and so forth). A write timing control circuit 59 controls the timing of a voltage as output from the wordline voltage control circuit 57.

[Application to Electronic Card and Electronic Apparatus]

Figure 32:
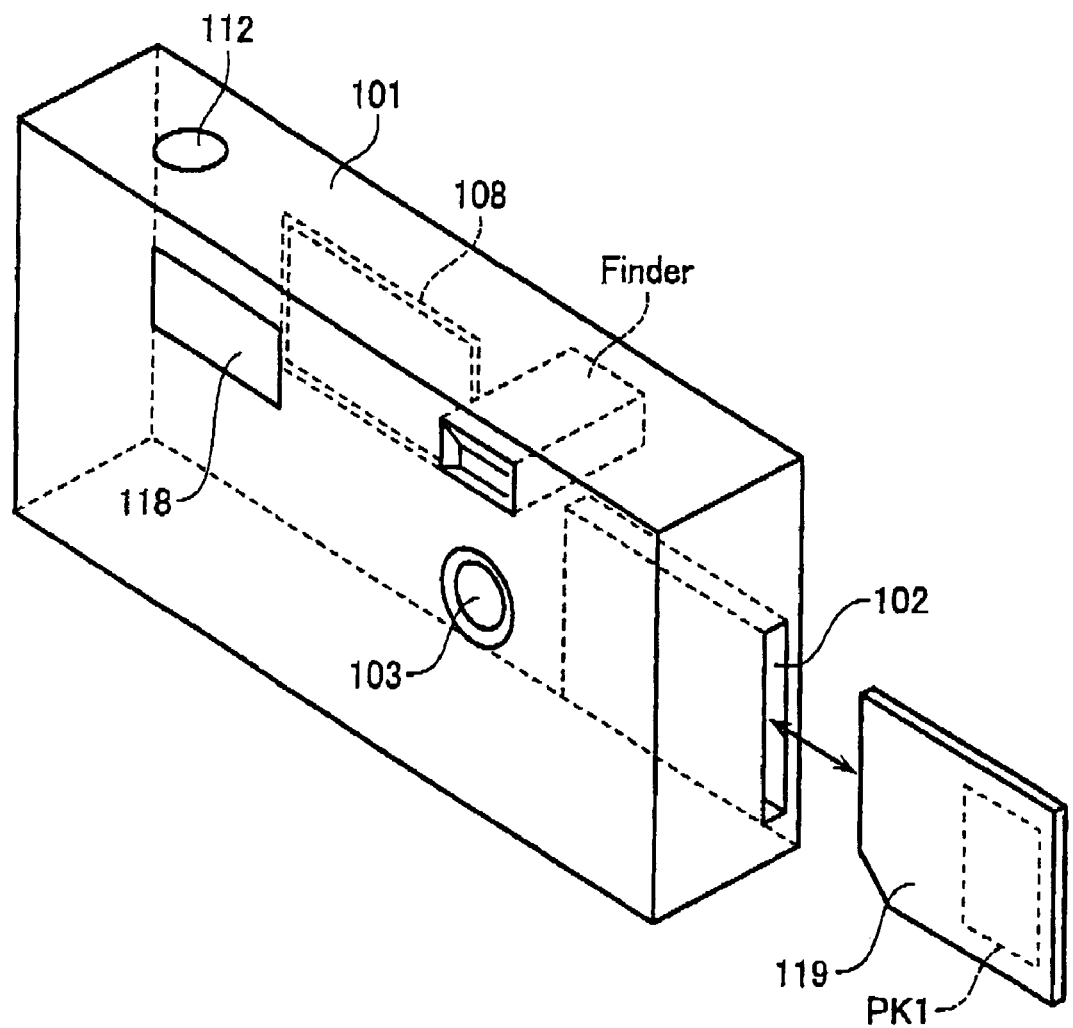
FIG. 32 is a diagram showing a perspective view of an electronic card and electronic apparatus in accordance with an embodiment of the invention.

An explanation will next be given of an electronic card and an electronic apparatus using the electronic card in accordance with an embodiment of this invention. FIG. 32 schematically shows a structure of an electronic card and an electronic apparatus in accordance with the embodiment of the invention. Here, regarding the electronic apparatus, a digital still camera 101 is shown as one example of handheld or "mobile" electronic equipment. The electronic card is a memory card 119 for use as a recording medium of the digital still camera 101. The memory card 119 has an integrated circuit (IC) package PK1 in which the nonvolatile semiconductor memory device that has been set forth in the embodiments of the invention is integrated and sealed.

The digital still camera 101 has its housing or casing structure which contains therein a card slot 102 and a printed circuit board (not shown) connected to this card slot 102. The memory card 119 is detachably inserted and plugged into the card slot 102. When loading into the card slot 102, the memory card 119 is electrically connected to electrical circuitry on the built-in circuit board.

In case the illustrative electronic card is an IC card of non-contact type for example, this card is connected to the electrical circuitry on the circuit board via wireless or radio signals, by letting it be received in the card slot 102 or alternatively placed in close proximity thereto.

Figure 33:
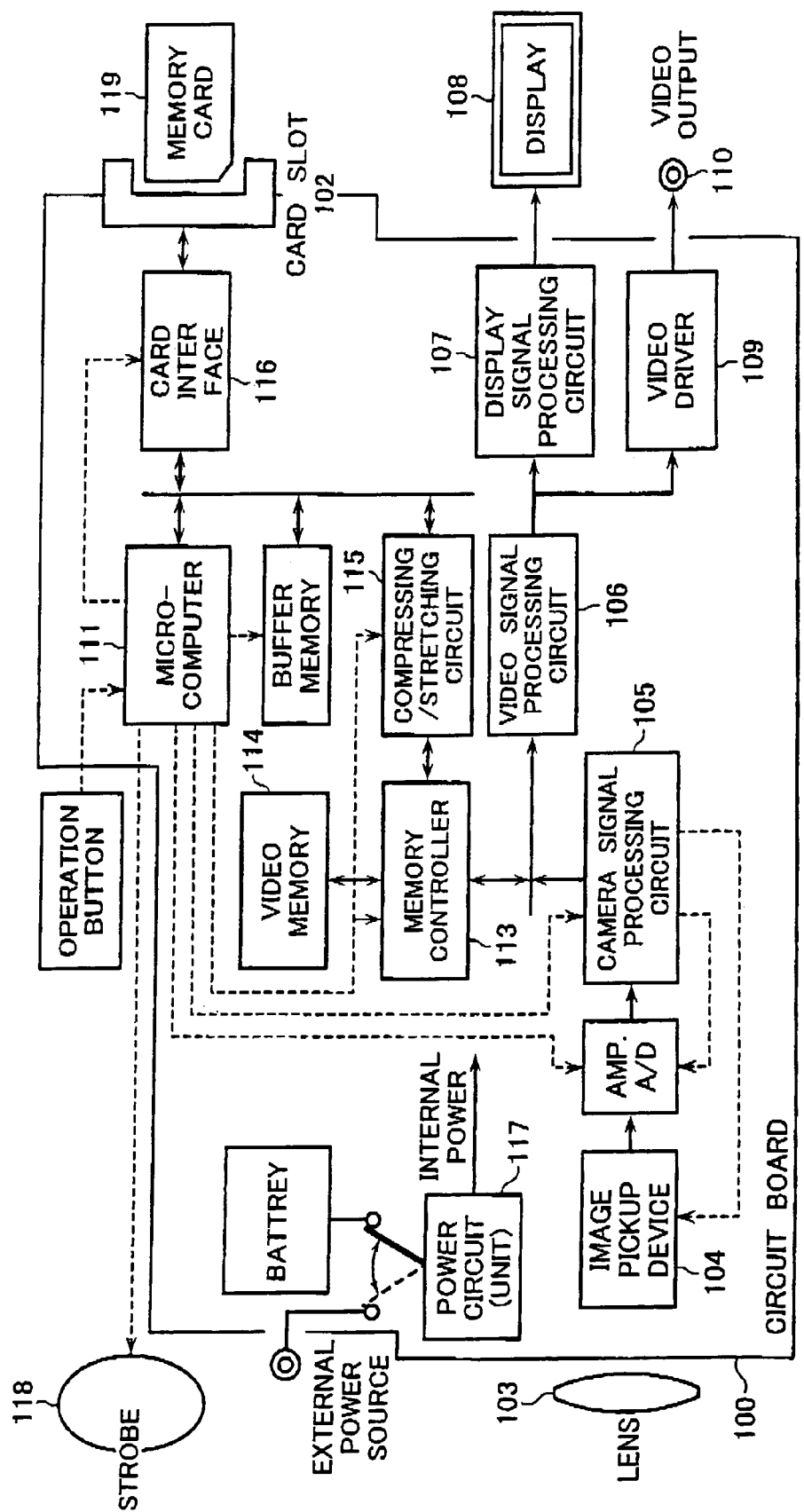
FIG. 33 shows a basic configuration of a digital still camera which is a first example of the electronic apparatus in accordance with the embodiment of this invention.

FIG. 33 shows a basic configuration of the digital still camera. Light rays coming from a target subject of shooting are gathered together by an optical lens 103 and then guided to enter an image pickup device 104. An example of the image pickup device 104 is a CMOS image sensor, which is operable to photoelectrically convert the input light and then output an analog signal. This analog signal is amplified by an analog amplifier (AMP) and thereafter is subjected to digital conversion by an analog-to-digital (A/D) converter. The resultant converted signal is input to a camera signal processing circuit 105 and then subjected to automatic exposure control (AE), automatic white balance control (AWB) and color separation processing, by way of example, and thereafter converted into a brightness or luminance signal and a color difference signal.

In the case of monitoring an image(s), the signal as output from the camera signal processing circuit 105 is input to a video signal processing circuit 106 for conversion to a video signal. A typical example of the video signal system as used herein may be the national television system committee (NTSC) standards. The video signal is sent forth via a display signal processing circuit 107 and then output to a display unit 108 which is attached to the digital still camera 101. The display unit 108 is a liquid crystal display (LCD) monitor, for example. The video signal is given through a video driver 109 to a video output terminal 110. An image as picked up or "photographed" by the digital still camera 101 can be output via the video output terminal 110 to an imaging equipment such as for example a television (TV) set. Whereby, it is possible to visually display the photographed image even at external equipment other than the built-in display unit 108. The image pickup device 104, analog amplifier (AMP), A/D converter (A/D) and camera signal processor circuit 105 are controlled by a microcomputer 111.

When an attempt is made to capture an image, an operator presses an operation button, such as a shutter button 112 for example. In responding thereto, the microcomputer 111 controls a memory controller 113 so that a signal as output from the camera signal processor circuit 105 is written as a frame image into a video memory 114. The frame image thus written into the video memory 114 is compressed by a compression/expansion processing circuit 115 based on a predetermined compression format and then recorded in the memory card 119 that is presently plugged into the card slot 102 via a card interface 116.

In the case of playback of the image thus recorded, read the image being recorded in the memory card 119 through the card interface 116, then let the compression/expansion processing circuit 115 expand or "stretch" the read image, and thereafter write it into the video memory 114. The written image is input to the video signal processor circuit 106 and then visualized at either the built-in display unit 108 or external imaging equipment in a similar way to the case of monitoring an image(s).

It should be noted that in this arrangement, those components mounted on the circuit board 100 are the card slot 102, image pickup device 104, analog amplifier (AMP), A/D converter (A/D), camera signal processing circuit 105, video signal processing circuit 106, memory controller 113, video memory 114, compression/expansion processing circuit 115, and card interface 116.

Note however that the card slot 102 should not always be mounted on the circuit board 100 and may alternatively be designed so that it is connected to the circuit board 100 by use of a connector cable or the like.

A power supply circuit 117 is further mounted on the circuit board 100. The power supply circuit 117 receives electrical power supply from either an external power supply unit or a battery module to thereby generate an internal power supply voltage as used inside of the digital still camera. A DC-to-DC converter may be used as the power supply circuit 117. The internal supply voltage is supplied to each of the above-stated circuits and also to an electric flash unit called "strobe" 118 and the display unit 108.

Figure 34A:
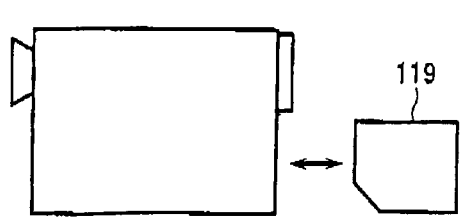
FIG. 34A is a diagram showing a video camera which is a second example of the electronic apparatus in accordance with the embodiment of this invention.
Figure 34F:
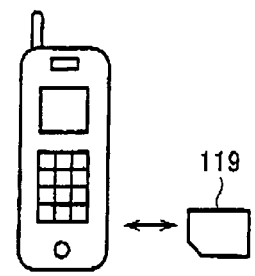
FIG. 34F is a diagram showing a cellular mobile telephone handset which is a seventh example of the electronic apparatus in accordance with the embodiment of the invention.
Figure 34B:
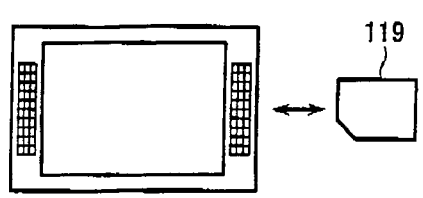
FIG. 34B is a diagram showing a television set which is a third example of the electronic apparatus in accordance with the embodiment of the invention.
Figure 34G:
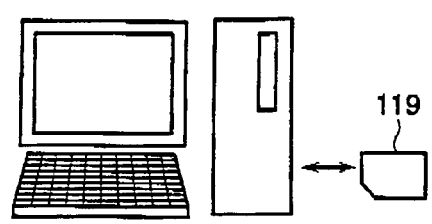
FIG. 34G is a diagram showing a personal computer which is an eighth example of the electronic apparatus in accordance with the embodiment of the invention.
Figure 34C:
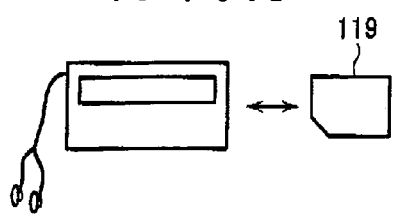
FIG. 34C is a diagram showing an audio equipment which is a fourth example of the electronic apparatus in accordance with the embodiment of the invention.
Figure 34H:
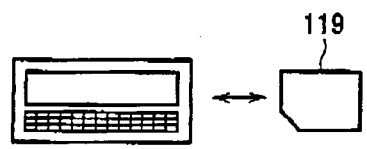
FIG. 34H is a diagram showing a personal digital assistant (PDA) which is a ninth example of the electronic apparatus in accordance with the embodiment of the invention.
Figure 34D:
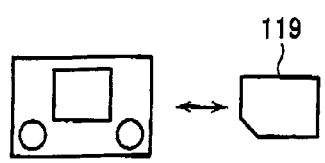
FIG. 34D is a diagram showing a video game console which is a fifth example of the electronic apparatus in accordance with the embodiment of the invention.
Figure 34I:
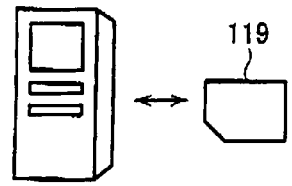
FIG. 34I is a diagram showing a voice recorder which is a tenth example of the electronic apparatus in accordance with the embodiment of the invention.
Figure 34E:
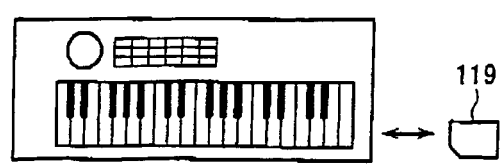
FIG. 34E is a diagram showing an electronic music instrument which is a sixth example of the electronic apparatus in accordance with the embodiment of the invention.
Figure 34J:
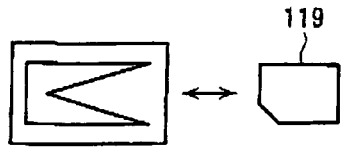
FIG. 34J is a diagram showing a PC card which is an eleventh example of the electronic apparatus in accordance with the embodiment of the present invention.

As stated above, the electronic card in accordance with the embodiment of this invention is usable with mobile electronic equipment such as digital still cameras or else. Furthermore, this electronic card is applicable not only to such mobile electronic equipment but also to various types of electronic equipment such as those shown in FIGS. 34A through 30J. More specifically, the electronic card stated above is employable for use with a video camera shown in FIG. 34A, a TV set shown in FIG. 34B, an audio apparatus shown in FIG. 34C, a video game console shown in FIG. 34D, an electronic music instrument shown in FIG. 34E, a cellular phone handset shown in FIG. 34F, a personal computer (PC) shown in FIG. 34G, a personal digital assistant (PDA) shown in FIG. 34H, a voice recorder shown in FIG. 34I, and a PC card shown in FIG. 34J.

The above-stated nonvolatile semiconductor memory device in accordance with the invention has first to fourth forms for reduction to practice as will be described below. As per these embodiments, it is possible to reduce coupling noises otherwise occurring at the word lines of memory cells. Thus it becomes possible to avoid erroneous writing or programming to memory cells even in cases where the distance between word lines becomes shorter with an increase in miniaturization of memory cells.

The first form of the nonvolatile semiconductor memory device in accordance with the invention is arranged to have a NAND cell with a serial connection of a plurality of electrically data rewritable memory cells, word lines connected to control gates of the memory cells, a common source line connectable to one end of the NAND cell, a bit line connectable to the other end of the NAND cell, and a word-line control circuit, characterized in that the wordline control circuit supplies the word line of a selected memory cell with a write voltage for writing data into this memory cell, supplies the word line of a memory cell which is located near the common source-line side by a distance equivalent to N cells (N is an integer more than or equal to 2) from the selected memory cell with a reference voltage for causing this memory cell to cut off, supplies an auxiliary voltage which is less in potential than the write voltage to each of the word lines of N−1 memory cells which are placed between the selected memory cell and the memory cell at the position of N cells, and supplies an intermediate or mid-level voltage between the write voltage and the reference voltage to word lines of the remaining memory cells.

In accordance with the first form of the invention, the mid-level voltage is supplied to the word line of either one of the neighboring memory cells on the both sides of the memory cell to be cut off, while the auxiliary voltage is supplied to the word line of the other memory cell thereof. With such an arrangement, the write voltage which is a relatively high voltage is not supplied to the word lines of the both-side neighboring memory cells of the memory cell to be cut off so that it is possible to reduce coupling noises otherwise occurring at the word line of the memory cell to be cut off. Thus it becomes possible to avoid erroneous writing or programming to the memory cell of interest.

The second form of the nonvolatile semiconductor memory device in accordance with the invention is arranged to have a NAND cell with a serial connection of a plurality of electrically data rewritable memory cells, word lines connected to the control gates of the memory cells, a common source line connectable to one end of the NAND cell, a bit line connectable to the other end of the NAND cell, and a word-line control circuit, featured in that the wordline control circuit supplies the word line of a selected memory cell with a write voltage for writing data into this memory cell, supplies the word lines of memory cells which are located near the common source-line side and the bitline side respectively by a distance equivalent to N cells (N is an integer more than or equal to 3) from the selected memory cell with a reference voltage for letting this memory cell cut off, supplies an auxiliary voltage less than the write voltage to each of the word lines of N−1 memory cells placed between the selected memory cell and the memory cell at the N-cell position, and supplies an intermediate voltage between the write voltage and the reference voltage to word lines of the remaining memory cells.

In accordance with the second form of the invention, setting the number N at an integer more than or equal to 3 makes it possible to increase the memory cells residing between the selected memory cell and the memory cell to be cut off. Accordingly, it is possible to increase the capacitance of a channel(s) being connected to the channel of the selected memory cell. Hence, in the channel of the selected memory cell, it is possible to lessen the potential drop-down amount which can cause leakage, which in turn makes it possible to avoid occurrence of write errors. Note here that this effect is also obtainable in case N is an integer greater than or equal to 3 in the first form. The third form of the nonvolatile semiconductor memory device in accordance with the invention is arranged to have a NAND cell with a serial connection of a plurality of electrically data rewritable memory cells, word lines connected to the control gates of the memory cells, a common source line connectable to one end of the NAND cell, a bit line connectable to the other end of the NAND cell, and a word-line control circuit, wherein the wordline control circuit supplies the word line of a selected memory cell with a write voltage for writing data into this memory cell, supplies the word line of at least a memory cell located on the common source-line side out of the memory cells that are placed near the common source-line side and the bitline side respectively by a distance equivalent to N cells (N is an integer more than or equal to 2) from the selected memory cell with a reference voltage for cutting this memory cell off, supplies an auxiliary voltage less than the write voltage to each of the word lines of N−1 memory cells which are positioned between the selected memory cell and the memory cell which resides at the position of N cells and which has its word line to which the reference voltage is supplied, supplies an intermediate voltage between the write voltage and the reference voltage to word lines of the remaining memory cells, and makes the timing for supplying the auxiliary voltage and that of the intermediate voltage different from each other.

As per the third form of the invention, it is possible to reduce coupling noises since the timing for supplying the auxiliary voltage and the timing for supplying the intermediate voltage are made different from each other. Due to this, it becomes possible to prevent write errors even in case the distance between word lines becomes shorter with an increase in miniaturization of memory cells.

The fourth form of the nonvolatile semiconductor memory device in accordance with the invention is arranged to have a NAND cell with a serial combination of a plurality of electrically data rewritable memory cells, word lines connected to the control gates of the memory cells, a common source line connectable to one end of the NAND cell, a bit line connectable to the other end of the NAND cell, and a word-line control circuit, wherein the wordline control circuit supplies the word line of a selected memory cell with a write voltage for writing data into this memory cell, supplies the word line of a memory cell which is located on the common source-line side by a distance equivalent to N cells (N is an integer more than or equal to 2) from the selected memory cell with a reference voltage for cutting this memory cell off, supplies an auxiliary voltage less in potential than the write voltage to each of the word lines of N−1 memory cells which are located between the selected memory cell and the memory cell at the N-cell position, supplies an intermediate voltage between the write voltage and the reference voltage to a bitline side neighboring word line which is a word line on the bitline side out of those word lines that are placed next to the word line of the selected word line, supplies the intermediate voltage to word lines of the remaining memory cells, and causes the timing for supplying the auxiliary voltage and the timing for supplying the intermediate voltage to the bitline side neighboring word line to be different from the timing for supplying the intermediate voltage to the word lines of the remaining memory cells.

As per the fourth form of the invention, since the timing for supplying the auxiliary voltage and the timing for supplying the intermediate voltage to the bitline side neighboring word line are made different from the timing for supplying the intermediate voltage to the word lines of the remaining memory cells, it is possible to reduce coupling noises. Due to this, it becomes possible to avoid write errors or failures even when the distance between word lines becomes shorter with an increase in miniaturization of the memory cells.

What is claimed is:

1. A nonvolatile semiconductor memory device comprising:
    a NAND cell with a plurality of electrically data rewritable memory cells being connected in series;
    word lines connected to control gates of said memory cells;
    a common source line connectable to one end of said NAND cell;
    a bit line connectable to a remaining end of said NAND cell; and
    a word line control circuit, wherein
    said word line control circuit supplies a word line of a selected memory cell with a write voltage for writing data into this memory cell,
    supplies a word line of a memory cell located on the common source line side by N (N is an integer greater than or equal to 2) cells from said selected memory cell with a reference voltage for causing this memory cell to cut off, supplies an auxiliary voltage less than said write voltage to respective word lines of N−1 memory cells located between said selected memory cell and said memory cell at the position of said N cells, and
    supplies to word lines of remaining memory cells an intermediate voltage between said write voltage and said reference voltage.

2. The device according to claim 1, wherein said auxiliary voltage is less than said write voltage and yet larger than a power supply voltage.

3. The device according to claim 1, wherein said auxiliary voltage is the same as said intermediate voltage.

4. The device according to claim 1, wherein said reference voltage is greater than or equal to a ground voltage and yet less than said auxiliary voltage.

5. The device according to claim 1, wherein said reference voltage is the same as a ground voltage.

6. The device according to claim 1, wherein a distance between said word lines is less than or equal to 90 nanometers ("nm").

7. The device according to claim 1, wherein a ratio of a thickness of said word lines to a distance between said word lines is greater than or equal to 3.

8. An electronic card equipped with the nonvolatile semiconductor memory device as recited in claim 1.

9. An electronic apparatus comprising:
    a card interface;
    a card slot connected to said card interface; and
    said electronic card as recited in claim 8 and being electrically connectable to said card slot.

10. The apparatus according to claim 9, wherein said electronic apparatus is a digital camera.

11. A nonvolatile semiconductor memory device comprising:
    a NAND cell with a plurality of electrically data rewritable memory cells being connected in series;
    word lines connected to control gates of said memory cells;
    a common source line connectable to one end of said NAND cell;
    a bit line connectable to a remaining end of said NAND cell; and
    a word line control circuit, wherein
    said word line control circuit supplies a word line of a selected memory cell with a write voltage for writing data into this memory cell,
    supplies word lines of memory cells respectively located on the common source line side and on the bit line side by N (N is an integer greater than or equal to 3) cells from said selected memory cell with a reference voltage for cutting this memory cell off,
    supplies an auxiliary voltage less than said write voltage to respective word lines of N−1 memory cells located between said selected memory cell and said memory cell at the position of said N cells, and
    supplies to word lines of remaining memory cells an intermediate voltage between said write voltage and said reference voltage.

12. The device according to claim 11, wherein said auxiliary voltage is less than said write voltage and yet larger than a power supply voltage.

13. The device according to claim 11, wherein said auxiliary voltage is the same as said intermediate voltage.

14. The device according to claim 11, wherein said reference voltage is greater than or equal to a ground voltage and yet less than said auxiliary voltage.

15. The device according to claim 11, wherein said reference voltage is the same as a ground voltage.

16. The device according to claim 11, wherein a distance between said word lines is less than or equal to 90 nm.

17. The device according to claim 11, wherein a ratio of a thickness of said word lines to a distance between said word lines is greater than or equal to 3.

18. An electronic card equipped with the nonvolatile semiconductor memory device as recited in claim 11.

19. An electronic apparatus comprising;
a card interface;
a card slot connected to said card interface; and
said electronic card as recited in claim 18 and being electrically connectable to said card slot.

20. The apparatus according to claim 19, wherein said electronic apparatus is a digital camera.

21. A nonvolatile semiconductor memory device comprising;
a NAND cell with a plurality of electrically data rewritable memory cells being connected in series;
word lines connected to control gates of said memory cells;
a common source line connectable to one end of said NAND cell:
a bit line connectable to a remaining end of said NAND cell; and
a word line control circuit, wherein
said word line control circuit supplies a word line of a selected memory cell with a write voltage for writing data into this memory cell,
supplies at least a word line of a memory cell located on the common source line side between memory cells located on the common source line side and on the bit line side by N (N is an integer greater than or equal to 2) cells from said selected memory cell, with a reference voltage for cutting this memory cell off,
supplies an auxiliary voltage less than said write voltage to respective word lines of N−1 memory cells located between said selected memory cell and the memory cell which is at the position of said N cells and which has its word line to which said reference voltage is supplied,
supplies to word lines of remaining memory cells an intermediate voltage between said write voltage and said reference voltage, and
makes a timing for supplying said auxiliary voltage different from that of said intermediate voltage.

22. The device according to claim 21, wherein said word line control circuit makes said auxiliary voltage later than said intermediate voltage in supply timing.

23. The device according to claim 22, wherein said word line control circuit makes said reference voltage earlier in supply timing than said write voltage, said auxiliary voltage and said intermediate voltage.

24. The device according to claim 21, wherein said word line control circuit begins simultaneously to supply a word line to which said auxiliary voltage is supplied and a word line to which said write voltage is supplied.

25. The device according to claim 21, wherein said word line control circuit begins to perform potential rise-up of a word line to which said write voltage is supplied prior to completion of rise-up of a word line to which said auxiliary voltage is supplied.

26. The device according to claim 21, wherein said auxiliary voltage is any one of a power supply voltage and a ground voltage.

27. The device according to claim 21, wherein said reference voltage is supplied only to the word line located on the common source line side between word lines of the memory cells located on the common source line side and on the bit line side by N (N is an integer more than or equal to 2) cells from said selected memory cell.

28. The device according to claim 21, wherein said reference voltage is supplied to word lines of memory cells respectively located on the common source line side and on the bit line side by N (N is an integer more than or equal to 2) cells from said selected memory cell.

29. The device according to claim 21, wherein said auxiliary voltage is less than said write voltage and yet larger than a power supply voltage.

30. The device according to claim 21, wherein said auxiliary voltage is the same as said intermediate voltage.

31. The device according to claim 21, wherein said reference voltage is greater than or equal to a ground voltage and yet less than said auxiliary voltage.

32. The device according to claim 21, wherein said reference voltage is the same as a ground voltage.

33. The device according to claim 21, wherein a distance between said word lines is less than or equal to 90 nm.

34. The device according to claim 21, wherein a ratio of a thickness of said word lines to a distance between said word lines is greater than or equal to 3.

35. An electronic card equipped with the nonvolatile semiconductor memory device as recited in claim 21.

36. An electronic apparatus comprising:
a card interface:
a card slot connected to said card interface: and
said electronic card as recited in claim 35 and being electrically connectable to said card slot.

37. The apparatus according to claim 36, wherein said electronic apparatus is a digital camera.

38. A nonvolatile semiconductor memory device comprising;
a NAND cell with a plurality of electrically data rewritable memory cells being connected in series;
word lines connected to control gates of said memory cells;
a common source line connectable to one end of said NAND cell;
a bit line connectable to a remaining end of said NAND cell; and
a word line control circuit, wherein
said word line control circuit supplies a word line of a selected memory cell with a write voltage for writing data into this memory cell,
supplies a word line of a memory-cell located on the common source line side by N (N is an integer greater than or equal to 2) cells from said selected memory cell with a reference voltage for cutting this memory cell off, supplies an auxiliary voltage less than said write voltage to respective word lines of N−1 memory cells located between said selected memory cell and said memory cell at the position of said N cells,
supplies an intermediate voltage between said write voltage and said reference voltage to one of word lines located next to the word line of said selected memory cell which is a bit-line side neighboring word line that is a word line on the bit line side,
supplies said intermediate voltage to word lines of remaining word lines, and
makes a timing for supplying said auxiliary voltage and a timing for supplying said intermediate voltage to said bit-line side neighboring word line different from a timing for supplying said intermediate voltage to the word lines of said remaining memory cells.

39. The device according to claim 38, wherein said word line control circuit makes the timing for supplying said auxiliary voltage and the timing for supplying said intermediate voltage to said bit-line side neighboring word line slower than the timing for supplying said intermediate voltage to the word lines of said remaining memory cells.

40. The device according to claim 39, wherein said word line control circuit makes said reference voltage faster in supply timing than said write voltage, said auxiliary voltage and said intermediate voltage.

41. The device according to claim 38, wherein said word line control circuit simultaneously begins to supply a word line to which said auxiliary voltage is supplied and a word line to which said write voltage is supplied and also said bit-line side neighboring word line to which said intermediate voltage is supplied.

42. The device according to claim 38, wherein said word line control circuit starts to perform potential rise-up of a word line to which said write voltage is supplied prior to completion of rise-up of a word line to which said auxiliary voltage is supplied and said bit-line side neighboring word line to which said intermediate voltage is supplied.

43. The device according to claim 38, wherein said auxiliary voltage is any one of a power supply voltage and a ground voltage.

44. The device according to claim 38, wherein said auxiliary voltage is less than said write voltage and yet larger than a power supply voltage.

45. The device according to claim 38, wherein said auxiliary voltage is the same as said intermediate voltage.

46. The device according to claim 38, wherein said reference voltage is greater than or equal to a ground voltage and yet less than said auxiliary voltage.

47. The device according to claim 38, wherein said reference voltage is the same as a ground voltage.

48. The device according to claim 38, wherein a distance between said word lines is less than or equal to 90 nm.

49. The device according to claim 38, wherein a ratio of a thickness of said word lines to a distance between said word lines is greater than or equal to 3.

50. An electronic card equipped with the nonvolatile semiconductor memory device as recited in claim 38.

51. An electronic apparatus comprising;
a card interface;
a card slot connected to said card interface; and
said electronic card as recited in claim 50 and being electrically connectable to said card slot.

52. The apparatus according to claim 51, wherein said electronic apparatus is a digital camera.

53. A nonvolatile semiconductor memory device comprising:
a NAND cell with a plurality of electrically data rewritable memory cells being connected in series;
word lines connected to control gates of said memory cells;
a common source line connectable to one end of said NAND cell;
a bit line connectable to a remaining end of said NAND cell; and
a word line control circuit, wherein
said word line control circuit supplies a word line of a selected memory cell with a write voltage for writing data into this memory cell,
supplies a word line of at least a memory cell located on the common source side of memory cells which are placed on the common source line side and on the bit line side by a degree corresponding to N cells (N is an integer greater than or equal to 2) from said selected memory cell with a reference voltage for causing this memory cell to cut off,
supplies a first auxiliary voltage less than said write voltage to a word line of one of memory cells located on both neighboring sides of said selected memory cell, which one is on the side with a word line to which said reference voltage is supplied,
respectively supplies second and third auxiliary voltages less than said write voltage to word lines of memory cells placed on both neighboring sides of the memory cell with said reference voltage being supplied to its word line,
supplies an intermediate voltage between said write voltage and said reference voltage to a word line of at least one memory cell of remaining memory cells except memory cells located between the memory cell having its word line to which said first auxiliary voltage is supplied and the memory cell having its word line to which the second auxiliary voltage is supplied, and
makes said second and third auxiliary voltages different in supply timing from each other.

54. The device according to claim 53, wherein said word line control circuit makes the first to third auxiliary voltages later in supply timing than said intermediate voltage.

55. The device according to claim 53, wherein said word line control circuit makes said reference voltage earlier in supply timing than said write voltage, the first to third auxiliary voltages and said intermediate voltage.

56. The device according to claim 53, wherein said word line control circuit simultaneously starts supplement for the word lines to which the first and second auxiliary voltages are supplied and the word line to which said write voltage is supplied.

57. The device according to claim 53, wherein said word line control circuit starts rise-up of the word line to which said write voltage is supplied prior to completion of rise-up of the word line to which said first auxiliary voltage is supplied.

58. The device according to claim 53, wherein said second auxiliary voltage is any one of a power supply voltage or a ground voltage.

59. The device according to claim 53, wherein the first to third auxiliary voltages are less than said write voltage and yet greater than a power supply voltage.

60. The device according to claim 53, wherein the first and third auxiliary voltages are the same as said intermediate voltage.

61. The device according to claim 53, wherein said reference voltage is greater than or equal to ground voltage and yet less than said second auxiliary voltage.

62. A nonvolatile semiconductor memory device comprising;
a NAND cell with a plurality of electrically data rewritable memory cells being connected in series;
word lines connected to control gates of said memory cells;
a common source line connectable to one and of said NAND cell:
a bit line connectable to a remaining end of said NAND cell; and
a word line control circuit, wherein
said word line control circuit supplies a word line of a selected memory cell with a write voltage for writing data into this memory cell,
supplies a word line of a memory cell located on the common source side by a degree corresponding to N cells (N is an integer greater than or equal to 2) from said selected memory cell with a reference voltage for causing this memory cell to cut off, supplies a first auxiliary voltage less than said write voltage to a word line of one of memory cells located on both neighboring sides of said selected memory cell, which one is on the common source side, respectively supplies second and third auxiliary voltages less than said write voltage to word lines of memory cells located on both neighboring sides of a memory cell with its word line to which said reference voltage is supplied, supplies a fourth auxiliary voltage less than said write voltage to a word line of one of the memory cells located on both neighboring sides of said selected memory cell, which one is on the bit line side, supplies an intermediate voltage between said write voltage and said reference voltage to a word line of at least one memory cell of remaining memory cells except memory cells located between the memory cell having its word line to which said first auxiliary voltage is supplied and the memory cell having its word line to which the second auxiliary voltage is supplied, and makes said second and third auxiliary voltages different in supply timing from each other.

63. The device according to claim 62, wherein said word line control circuit makes the first to fourth auxiliary voltages later in supply timing than said intermediate voltage.

64. The device according to claim 62, wherein said word line control circuit makes said reference voltage earlier in supply timing than said write voltage, the first to fourth auxiliary voltages and said intermediate voltage.

65. The device according to claim 62, wherein said word line control circuit simultaneously starts supplement for the word lines to which the first, second and fourth auxiliary voltages are supplied and the word line to which said write voltage is supplied.

66. The device according to claim 62, wherein said word line control circuit starts rise-up of the word line to which said write voltage is supplied prior to completion of rise-up of the word lines to which the first and fourth auxiliary voltages are supplied.

67. The device according to claim 62, wherein said second auxiliary voltage is any one of a power supply voltage or a ground voltage.

68. The device according to claim 62, wherein the first to fourth auxiliary voltages are less than said write voltage and yet greater than a power supply voltage.

69. The device according to claim 62, wherein the first, third and fourth auxiliary voltages are the same as said intermediate voltage.

70. The device according to claim 62, wherein said reference voltage is greater than or equal to ground voltage and yet less than said second auxiliary voltage.

* * * * *